(12) United States Patent
Tanimizu et al.

(10) Patent No.: US 10,205,429 B2
(45) Date of Patent: Feb. 12, 2019

(54) OUTPUT-NOISE REDUCTION DEVICE

(71) Applicant: KITAGAWA INDUSTRIES CO., LTD., Inazawa-shi, Aichi-ken (JP)

(72) Inventors: Tomokazu Tanimizu, Nagoya (JP); Kazushige Ueno, Gifu (JP); Katsuyuki Morita, Ama-gun (JP); Yoshinori Ohashi, Kitanagoya (JP)

(73) Assignee: KITAGAWA INDUSTRIES CO., LTD., Inazawa (JP)

( * ) Notice: Subject to any disclaimer, the term of this patent is extended or adjusted under 35 U.S.C. 154(b) by 317 days.

(21) Appl. No.: 15/271,879

(22) Filed: Sep. 21, 2016

(65) Prior Publication Data
US 2017/0012593 A1  Jan. 12, 2017

Related U.S. Application Data

(63) Continuation of application No. PCT/JP2015/075708, filed on Sep. 10, 2015.

(30) Foreign Application Priority Data

Sep. 11, 2014 (JP) .................. 2014-185031

(51) Int. Cl.
*H03H 1/00* (2006.01)
*H01F 17/06* (2006.01)
(Continued)

(52) U.S. Cl.
CPC ............... *H03H 1/00* (2013.01); *H01F 17/06* (2013.01); *H01F 27/022* (2013.01); *H01F 27/06* (2013.01);
(Continued)

(58) Field of Classification Search
USPC .................................... 361/117–119
See application file for complete search history.

(56) References Cited

U.S. PATENT DOCUMENTS 6,700,357 B2   3/2004  Taniguchi
9,276,546 B2 *  3/2016  Craig .................... H01F 27/26
(Continued)

FOREIGN PATENT DOCUMENTS

CN    105453399 A    3/2016
DE    202013104903 U1  11/2013
(Continued)

OTHER PUBLICATIONS

Mar. 14, 2017 International Preliminary Report on Patentability issued in Patent Application No. PCT/JP2015/075708.
(Continued)

*Primary Examiner* — Danny Nguyen
(74) *Attorney, Agent, or Firm* — Oliff PLC

(57) ABSTRACT

An object is to provide an output-noise reduction device that can prevent noise from an electronic device accommodated in a metal casing from being transmitted due to electromagnetic coupling. An output voltage is extracted to the outside through a conducting bar. A magnetic body core includes a through hole through which the conducting bar is inserted. A chip capacitor is mounted on a mounting board and connects between the output terminal VO and ground potential. A section from the output terminal VO to at least part of the chip capacitor mounted on the mounting board is isolated from the electromagnetic coupling from the electronic device. Thus, noise is prevented from being transmitted to the output terminal VO.

20 Claims, 19 Drawing Sheets

(51) Int. Cl.
  *H01F 27/06* (2006.01)
  *H01F 27/02* (2006.01)
  *H01F 27/28* (2006.01)
  *H05K 1/02* (2006.01)
  *H05K 3/42* (2006.01)

(52) U.S. Cl.
  CPC .... *H01F 27/2885* (2013.01); *H01F 2017/065* (2013.01); *H03H 2001/0021* (2013.01); *H05K 1/0215* (2013.01); *H05K 1/0233* (2013.01); *H05K 3/42* (2013.01); *H05K 2201/1006* (2013.01); *H05K 2201/1009* (2013.01); *H05K 2201/10409* (2013.01)

(56) References Cited

U.S. PATENT DOCUMENTS

| | | | |
|---|---|---|---|
| 9,704,638 B2 | 7/2017 | Tanimizu et al. | |
| 2002/0057026 A1 | 5/2002 | Taniguchi | |
| 2008/0100400 A1* | 5/2008 | Lucas | H05K 9/0066 333/181 |
| 2016/0148745 A1 | 5/2016 | Tanimizu et al. | |

FOREIGN PATENT DOCUMENTS

| | | |
|---|---|---|
| JP | S57-25713 A | 2/1982 |
| JP | H05-327266 A | 12/1993 |
| JP | H11-8123 A | 1/1999 |
| JP | 2001-217051 A | 8/2001 |
| JP | 2001-238496 A | 8/2001 |
| JP | 2005-093536 A | 4/2005 |
| WO | 2015/020077 A1 | 2/2015 |
| WO | 2015/098830 A1 | 7/2015 |

OTHER PUBLICATIONS

Dec. 8, 2015 International Search Report issued in Patent Application No. PCT/JP2015/075708.

Apr. 4, 2018 Office Action issued in Chinese Patent Application No. 201580014789.9.

Oct. 19, 2017 European Search Report Issued in Patent Application No. 15839669.7.

* cited by examiner

OUTPUT-NOISE REDUCTION DEVICE

CROSS-REFERENCE TO RELATED APPLICATION

This application is based upon and claims the benefit of priority of the prior Japanese Patent Application No. 2014-185031, filed on Sep. 11, 2014, the entire contents of which are incorporated herein by reference.

FIELD

A technique disclosed in the present application relates to an output-noise reduction device that reduces noise mixed in output voltage and the like flowing in a conducting bar, and particularly relates to a noise reduction device including an inductor element inserted in a signal path of an output signal.

BACKGROUND

Switching noise at operation frequency of an electronic device and the like as well as its harmonic frequency might be mixed in output voltage and an output signal output from a switching power supply and other electronic devices via a conducting bar. Such switching noise might negatively affect supplying devices such as an external electronic device, and thus needs to be reduced as appropriate. The switching power supply outputs output voltage of a predetermined voltage value through a switching operation of a power transistor. When the power transistor is turned ON and OFF, the current path is switched, and this might generate noise at a switching frequency and its harmonic frequency depending on a rated output. The noise is superimposed on the output voltage to be transmitted to the supplying device via the conducting bar and negatively affects the supplying device. Thus, a device for reducing such noise needs to be provided. In one known output-noise reduction device, a conducting bar is inserted to a magnetic body core to form a noise filter for removing the noise flowing in the conducting bar (see, for example, Patent Literature 1).

[Patent Literature 1] Japanese Laid-open Patent Publication No. 2005-93536

SUMMARY

An output-noise reduction device disclosed in the present application is an output-noise reduction device that reduces noise mixed in an output signal output from an electronic device accommodated in a metal casing to a supplying device. The output-noise reduction device includes a conducting bar, a first magnetic body core, a molded member, and a first mounting board. The conducting bar is made of a conductive material, and has one end portion serving as a connection terminal to be connected to an output end of the electronic device, and another end portion serving as an output terminal. The first magnetic body core is made of a magnetic material and includes a through hole through which the conducting bar is inserted. The molded member is made of a resin material and encapsulates a portion of the conducting bar excluding the connection terminal and the output terminal and the first magnetic body core. The first mounting board is encapsulated by the molded member, and includes: a first fixing portion fixed to a portion of the conducting bar between the first magnetic body core and the output terminal; a second fixing portion connected to the metal casing; and a first connecting portion with a capacitive element connecting between the first fixing portion and the second fixing portion. A section from the output terminal to at least part of a main body portion including a capacitive component of the capacitive element mounted on the first mounting board is isolated from electromagnetic coupling from the electronic device.

The object and advantages of the invention will be realized and attained by means of the elements and combinations particularly pointed out in the claims.

It is to be understood that both the forgoing general description and the following detailed description are exemplary and explanatory and are not restrictive of the invention.

DESCRIPTION OF EMBODIMENTS

To ensure reliability and the like under a harsh peripheral environment including vibrations, dust, temperature, and the like in a field of automobiles, the switching power supply and the other electronic devices are embedded on a base plate or an electronic circuit board. Alternatively, the switching power supply and the other electronic devices may be incorporated in a casing made of metal such as aluminum. This means that a mounted component is accommodated to be isolated from the outside. In this configuration, reliability and the like need to be ensured also for the output-noise reduction device for reducing the noise. Thus, generally, the output-noise reduction device is also mounted in a casing made of metal.

Unfortunately, the conventional technique described above does not sufficiently reduce the output noise generated by the switching operation of the switching power supply and the other electronic devices to a sufficient level. More specifically, the noise is transmitted to an output terminal as conductive noise transmitted in a circumventing manner through signal wiring and ground wiring, and radiation noise radiated due to electromagnetic coupling such as capacitive coupling and inductive coupling. In particular, a source of the noise generated due to the switching operation and the conducting bar or the output terminal are close to each other in terms of the circuit configuration, and might be mounted at positions close to each other. Thus, the noise generated by the switching operation is radiated due to the electromagnetic coupling such as capacitive coupling and inductive coupling of parasitic capacitive components and inductive components, and is transmitted through the signal path and the ground wiring depending on the routes and the positional relationship of the signal path and the ground wiring. Thus, the noise might circumvent an output path of the output-noise reduction device providing the designed noise reducing function, to reach the conducting bar and the output terminal. All things considered, there has been a problem in that even when the output-noise reduction device is provided on the output path such as the conducting bar reaching the output terminal, the noise mixes into the conducting bar and the output terminal on the downstream side of the output-noise reduction device and thus is unable to be sufficiently reduced.

The technique disclosed in the present application is made in view of the problem described above, and an object of the present application is to provide an output-noise reduction device that can prevent noise, radiated due to electromagnetic coupling or transmitted in a circumventing manner through wiring in an electronic device accommodated in a metal casing, from being transmitted to an output terminal.

Figure 1:
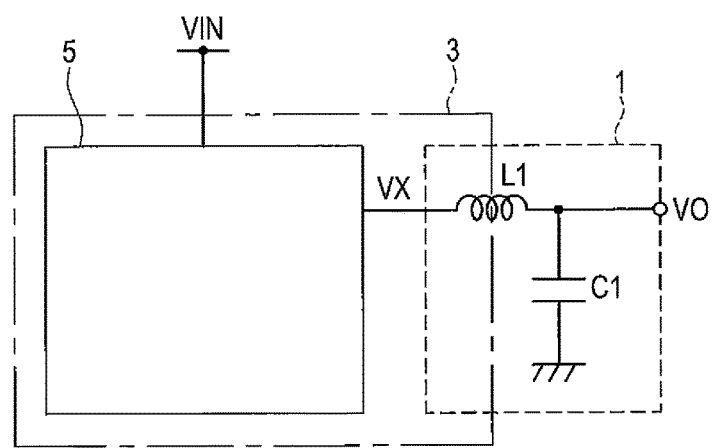
FIG. 1 is a circuit diagram illustrating a configuration in which a noise filter module as an example of an output-noise reduction device according to a first embodiment is connected to a switching power supply.

First and second embodiments of the present invention are described with reference to the drawings. FIG. 1 is a circuit diagram illustrating a noise filter module 1, as one example of an output-noise reduction device according to the present application, in a state where the noise filter module 1 is connected between an output terminal VX of a switching power supply 5 and an output terminal VO. The switching power supply 5 is accommodated in a metal casing 3 made by aluminum die casting and the like. For example, the switching power supply 5 is an on-vehicle power supply and is a step-down switching power supply that steps down a voltage value of driving power supply voltage VIN supplied from an in battery (not illustrated) in a hybrid vehicle, an electric vehicle, or the like, and supplies resultant power to an auxiliary battery (not illustrated). The auxiliary battery supplies power supply voltage to on-vehicle electronic devices such as an audio device, an air conditioner device, and a lighting device.

The switching power supply 5 performs ON/OFF control on a power transistor (not illustrated) at a predetermined switching frequency f to obtain an output of predetermined voltage. In the switching power supply 5, a current path is switched with the power transistor turned ON and OFF in accordance with such a switching operation, whereby alternate voltage fluctuation occurs between high voltage and low voltage at the switching frequency f. In the switching power supply 5, current, corresponding to load current, alternately and thus intermittently flows from the power supply voltage VIN and to ground potential GND, whereby current fluctuation occurs. Thus, in the switching power supply 5, the voltage fluctuation and the current fluctuation due to the switching operation might be a cause of switching noise at the switching frequency f and its harmonic frequency. For example, such switching noise might be transmitted to the output terminal VX as conductive noise, transmitted in a circumventing manner through a signal path and ground wiring, and inductive noise, transmitted through a space due to electromagnetic coupling such as capacitive coupling and inductive coupling. For example, the inductive noise may be generated due to voltage fluctuation in internal connection. More specifically, unwanted voltage fluctuation might occur in a coupled circuit element due to capacitive coupling of parasitic capacitive components between circuit elements, wiring, and the like. The voltage fluctuation might also occur due to current fluctuation of the power supply voltage VIN and the ground potential GND. More specifically, unwanted voltage fluctuation might occur in the power supply voltage VIN and the ground potential GND due to back electromotive force due to parasitic inductive components in wiring routes for the power supply voltage VIN and the ground potential GND.

In the switching power supply 5 according to the present embodiment, the noise filter module 1 is connected to the output terminal VX. The noise filter module 1 has what is known an LC filter structure with a choke coil L1 provided in an output voltage path connecting between the output terminal VX of the switching power supply 5 and the output terminal VO, and a capacitor C1 connected between the output terminal VO and the ground potential GND. The switching frequency f in the switching power supply 5 depends on the rated output power and specifications of components. For example, some switching power supplies installed in vehicles are operated at several hundred kHz. In such a case, the switching frequency f and its harmonic frequency might overlap with frequency bands of an on-vehicle AM radio receiver, and the noise filter module 1 can reduce noise transmitted on the signal path in such a band.

The noise filter module 1 according to the first embodiment is disposed to have a part of the choke coil L1 on a side of the output terminal VO and the capacitor C1 positioned outside the metal casing 3. Thus, the output terminal VO as the connecting point between the choke coil L1 and the capacitor C1, that is, a portion of a conducting bar 11 protruding from a magnetic body core 13 toward the output terminal VO described later is shielded by the metal casing 3. Thus, the radiation noise is prevented from being transmitted to the output terminal VO. The radiation noise can be prevented from mixing in the output voltage.

Figure 2:
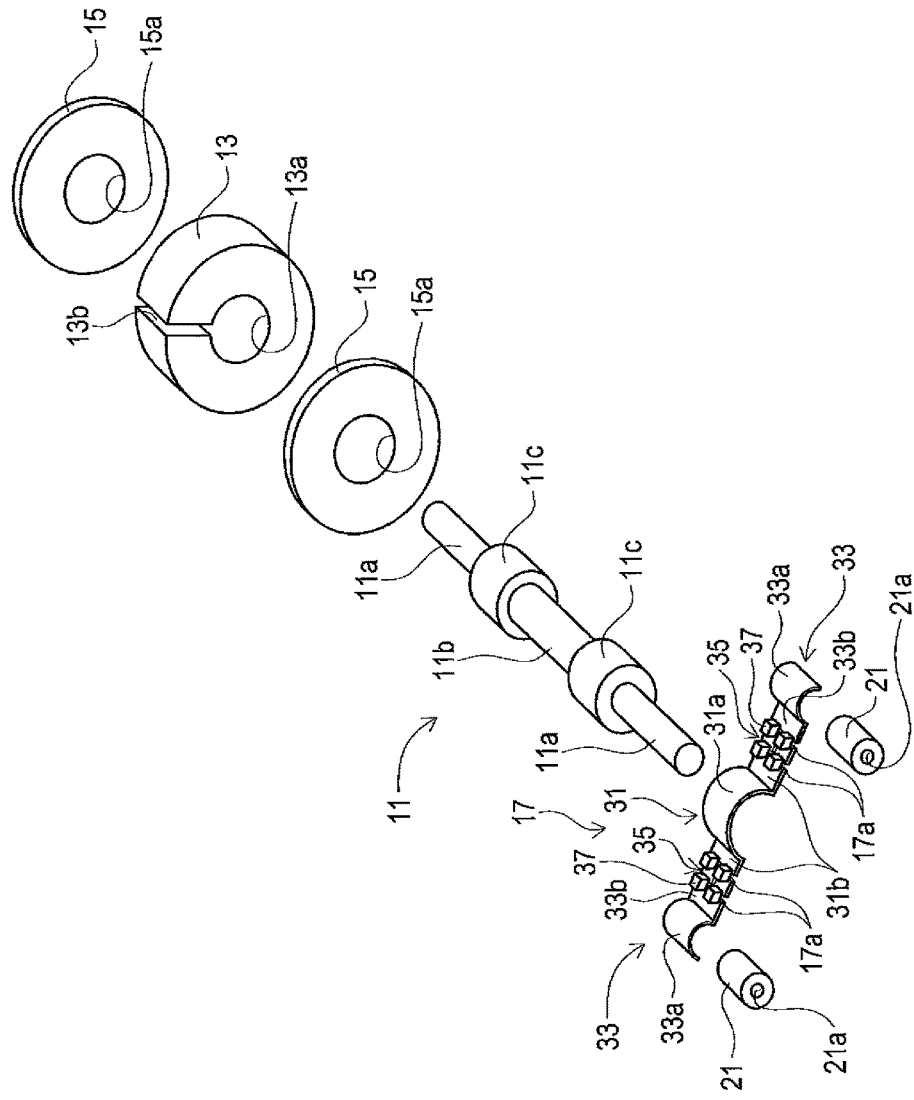
FIG. 2 is an exploded perspective view of the noise filter module according to the first embodiment.
Figure 3A:
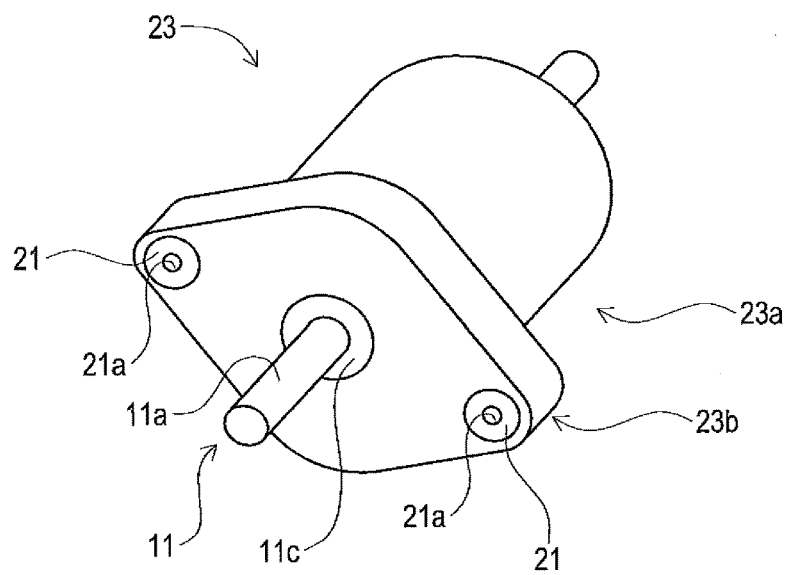
FIGS. 3A-3B are perspective views of the noise filter module according to the first embodiment ((A) is a perspective view illustrating a molded state, and (B) is a see-through perspective view illustrating an internal structure).
Figure 3B:
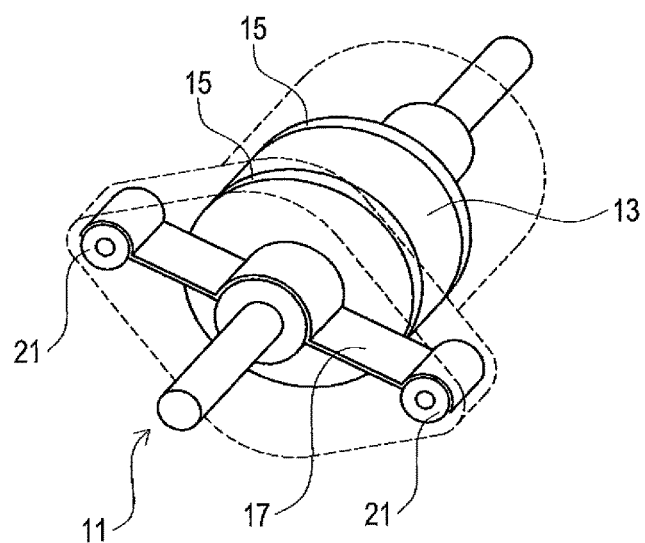

Next, a shape/structure of the module configuration of the noise filter module 1 according to the first embodiment will be described. FIG. 2 is an exploded perspective view of the noise filter module 1. FIGS. 3A-3B are perspective views of the noise filter module 1. FIG. 3A is a perspective view illustrating a state as a result of molding. FIG. 3B is a see-through perspective view illustrating an internal structure. A configuration of a mounting board 17 is partially omitted from the drawings for the sake of illustration.

The conducting bar 11 serves as an output voltage path connecting between the output terminal VX of the switching power supply 5 and the output terminal VO illustrated in FIG. 1. The conducting bar 11 has a substantially cylindrical shape, and is made of a metal material such as chrome molybdenum steel or carbon steel for example. Anchor portions 11c are formed on both sides of a center portion 11b in an axial direction, and bolt portions 11a are formed on both end portions more on the outer side than the anchor portions 11c. The bolt portion 11a has a bolt structure with a male screw, and has a shape of a stud bolt. One of the bolt portions 11a (right side in FIG. 2) is connected to the output terminal VX of the switching power supply 5 disposed in the metal casing 3. The other of the bolt portions 11a (left side in FIG. 2) serves as the output terminal VO and is connected to an electronic device and the like on the subsequent stage. The axis of the bolt portions 11a, the axis of the center portion 11b, and the axis of the anchor portions 11c are arranged on the same linear line, and the conducting bar 11 is formed with a single metal material to be in a linear shape. The center portion 11b and the anchor portion 11c have cross sectional shapes of concentric circles around the axis as viewed in the axial direction. The anchor portion 11c has a larger diameter than that of the center portion 11b.

The magnetic body core 13 includes a hollow portion 13a to have a hollow cylindrical shape, and is made of a magnetic material such as ferrite. The magnetic body core 13 further includes a slit 13b formed through a radial direction and extending in parallel with the axial direction, and a partially discontinuous path is achieved in a circumference direction of the magnetic body core 13. With what is known as a core gap thus formed, the magnetic resistance of the magnetic body core 13 is adjusted to prevent magnetic saturation from occurring. The choke coil L1 is formed with the conducting bar 11 inserted through the hollow portion 13a of the magnetic body core 13, and arranged to have the inner side surface of the hollow portion 13a facing the center portion 11b of the conducting bar 11. The magnetic saturation is prevented with the magnetic resistance adjusted by adjusting the width of the slit 13b, whereby the inductance of the choke coil L1 needed for removing the noise component can be ensured.

The axial direction of the conducting bar 11 corresponds to an insertion direction through the magnetic body core 13.

The magnetic body core 13 has both end surfaces in the insertion direction each provided with an electromagnetic shielding plate 15. The electromagnetic shielding plate 15 includes a hollow portion 15a to have an annular shape, as in the case of the magnetic body core 13, and the conducting bar 11 is inserted through the hollow portion 15a. The electromagnetic shielding plate 15 is formed of a conductive metal material such as copper, nickel, or iron for example, a conductive coating including metal material powder or foil, or a conductive polymer film. The diameter of the hollow portion 15a is adjusted to prevent contact with the conducting bar 11. The electromagnetic shielding plate 15 has an effect of electrically shielding the conducting bar 11 inserted through the hollow portion 13a of the magnetic body core 13. The capacitive coupling to the conducting bar 11 is prevented, whereby the radiation noise can be prevented from being transmitted outward from the conducting bar 11. At the same time, the radiation noise from the outside can be prevented from being transmitted to the conducting bar 11. The electromagnetic shielding plate 15, provided on each of both side surfaces of the magnetic body core 13 in the present embodiment, may be provided one of the end surfaces.

Seat portions 21 are each a cylindrical metal member having a through hole 21a in which a non-illustrated screw or the like is inserted, for fixing a molded member 23 (described later with reference to FIG. 3A), encapsulating the noise filter module 1, to the metal casing 3. The seat portions 21 are disposed on end portions of a flange portion 23b (described later with reference to FIG. 3A) of the molded member 23, on both left and right sides of the conducting bar 11.

The mounting board 17 couples between the conducting bar 11 and the seat portions 21. The mounting board 17 includes: a first fixing portion 31 at the center; second fixing portions 33 at both end portions; and connecting portions 35 each positioned between the first fixing portion 31 and a corresponding one of the second fixing portions 33 at both end portions. The first fixing portion 31, the second fixing portions 33, and the connecting portions 35 are each made of a highly conductive metal material (for example, brass, copper, or the like). The first fixing portion 31 includes: a trunk portion 31a having an arch shape extending along an outer circumference surface of the anchor portion 11c of the conducting bar 11; and ribs 31b extending linearly from both end portions of the trunk portion 31a toward the connecting portions 35. The second fixing portions 33 each include: a trunk portion 33a having an arch shape extending along an outer circumference surface of the seat portions 21; and a rib 33b extending linearly from the end portion of the trunk portion 33a toward the connecting portion 35. The trunk portion 31a with the arch shape covers approximately the half of the entire circumference of the anchor portion 11c, and the trunk portion 33a with the arch shape covers approximately the half of the entire circumference of the seat portions 21. The ribs 31b and 33b each extend in a direction substantially orthogonal to a direction connecting between the anchor portion 11c and the seat portions 21, that is, the axial direction of the conducting bar 11. The connecting portion 35 has a rectangular plate shape segmented for each chip capacitor 37. Each of the ribs 31b and 33b and the connecting portion 35 are arranged with a board slit 17a in between and with their relative positions fixed with an insulating material such as a resin material. Thus, each of the ribs 31b and 33b and the connecting portion 35 form a land area on which each terminal of the chip capacitors 37 is fixed by soldering and the like. The trunk portion 31a is fixed to the anchor portion 11c and the trunk portions 33a are fixed to the seat portions 21, by welding and the like. Four chip capacitors 37 are mounted on a portion between the first fixing portion 31 and each of the second fixing portions 33. More specifically, two pairs of two chip capacitors 37 connected to each other in series are mounted in parallel. The anchor portion 11e to which the first fixing portion 31 is fixed serves as the output terminal VO, and the ground potential GND is supplied to the seat portions 21 to which the second fixing portions 33 are fixed. The chip capacitors 37 form the capacitor C1.

For example, the mounting board 17 can be formed through the following steps. First of all, a flat metal plate is punched by a punching process and the like, so that a flat plate member is formed, in which thin metal wires bridge between: members that are in a state of being flat plates at this point and are supposed to be the first fixing portion 31 and the second fixing portions 33; and members that are supposed to be the connecting portions 35 and are each positioned between the member that is supposed to be the first fixing portion 31 and a corresponding one of the members that are supposed to be the second fixing portions 33. Then, the first fixing portion 31 and the second fixing portions 33 are formed into an arch shape through a pressing process and the like. Next, the chip capacitors 37 are mounted, and thereafter the insulating member such as epoxy resin is used to connect between the first fixing portion 31 and the connecting portion 35 and between the second fixing portions 33 and the connecting portions 35. Finally, the bridging portions formed by the thin metal wires are cut.

FIGS. 3A-3B illustrate the molded member 23 obtained by encapsulating the noise filter module 1, assembled in the manner described above, with thermoset resin (see FIG. 3A). FIG. 3B is a see-through perspective view of the molded member 23 illustrating its internal structure. The thermoset resin is used so that the magnetic body core 13 receives no excessive pressure. Examples of the thermoset resin include phenol resin, epoxy resin, unsaturated polyester, and the like.

The molded member 23 includes a core portion 23a and the flange portion 23b. The core portion 23a is obtained by molding in such a manner as to encapsulate the magnetic body core 13 through which the conducting bar 11 is inserted together with the conducting bar 11, and have a cylindrical shape having an axis matching the insertion direction. The flange portion 23b is formed by molding in such a manner as to encapsulate the anchor portion 11e of the conducting bar 11 on a side of the output terminal VO, the mounting board 17, and the seat portions 21, with the bolt portion 11a (output terminal VO) and both end surfaces of the seat portions 21 in the axial direction exposed, and to have a rectangular surface shape orthogonal to the axial direction.

Figure 4:
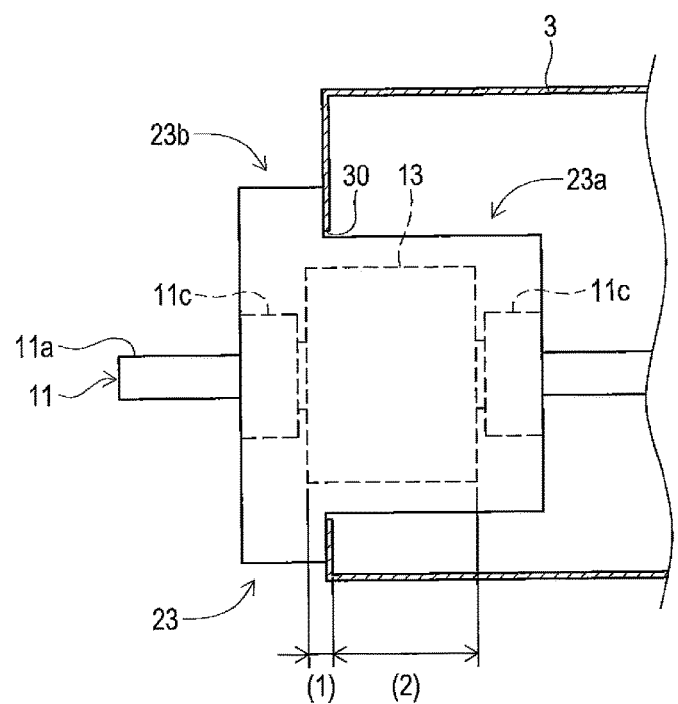
FIG. 4 is a cross-sectional view of a metal casing 3 taken along an axis of a conducting bar 11, illustrating a state where the noise filter module in the first embodiment is assembled to the switching power supply.

As illustrated in FIG. 4, the molded member 23 is attached in such a manner as to have an end surface (rear end surface) on a side of the core portion 23a of the flange portion 23b facing an outer end surface of the metal casing 3. The molded member 23 is screwed into the openings of the seat portions 21, with screws, bolts, or the like (not illustrated) to be attached to the metal casing 3. Thus, the flange portion 23b and the metal casing 3 can be attached to each other with their end surfaces in close contact with each other, which ensures that the noise filter module 1 is fixedly attached to the metal casing 3. The attaching can be achieved with a general fixing technique other than screwing such as caulking or welding.

The chip capacitors 37 (capacitor C1) are encapsulated in the flange portion 23b. The magnetic body core 13 has a section (a section (2) in FIG. 4) from one end to an intermediate portion encapsulated in the core portion 23a, and has the remaining area (area (1) in FIG. 4) encapsulated in the flange portion 23b. The molded member 23 is fixed to the metal casing 3 with the rear end surface of the flange portion 23b in close contact with the outer end surface of the metal casing 3. In this state, the chip capacitors 37 (capacitor C1) are disposed in the flange portion 23b, and the flange portion 23b is on the outer side of the metal casing 3. An end portion (outer side end portion) of the area (1) in the magnetic body core 13 is disposed in the flange portion 23b, and a portion (output terminal VO) of the conducting bar 11 protruding outward from the outer side end portion of the magnetic body core 13 is disposed outside the metal casing 3. Thus, the electromagnetic shielding effect provided by the metal casing 3 prevents the electromagnetic coupling to the chip capacitors 37 (capacitor C1) and to the portion of the conducting bar 11 (output terminal VO) protruding from the outer side end portion of the area (1) of the magnetic body core 13; in other words, the radiation noise is prevented from being transmitted to the chip capacitors 37 (capacitor C1) and the output terminal VO. The voltage fluctuation can be prevented from reaching the chip capacitors 37 (capacitor C1) in a circumventing manner via the ground potential GND. The conductive noise can be prevented from being transmitted to the chip capacitors 37 (capacitor C1) and the output terminal VO. The ground potential GND of the chip capacitors 37 (capacitor C1) is connected to the metal casing 3 via the seat portions 21, but still the impedance of the metal casing 3 is low enough to prevent the voltage fluctuation of the ground potential GND due to the conductive noise.

Figure 5A:
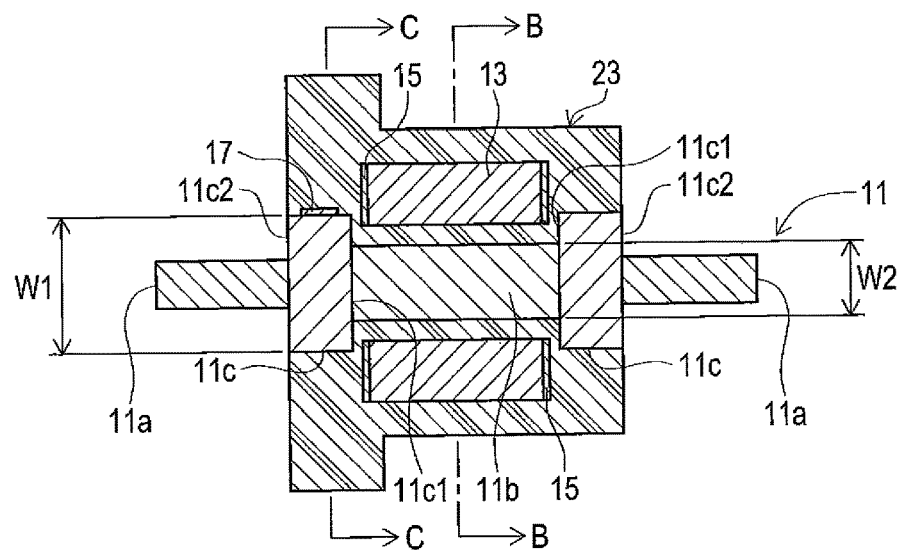
FIGS. 5A-5C are schematic cross-sectional views of an internal structure of the noise filter module in the first embodiment ((A) is a cross-sectional view taken along the conducting bar 11, (B) is a cross-sectional view taken along line BB, and (C) is a cross-sectional view taken along line CC).
Figure 5B:
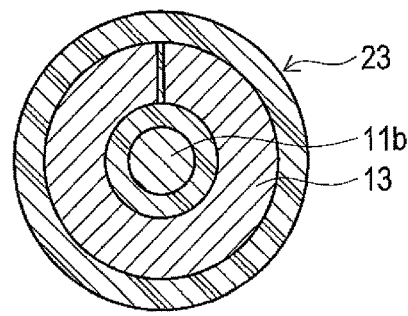
Figure 5C:
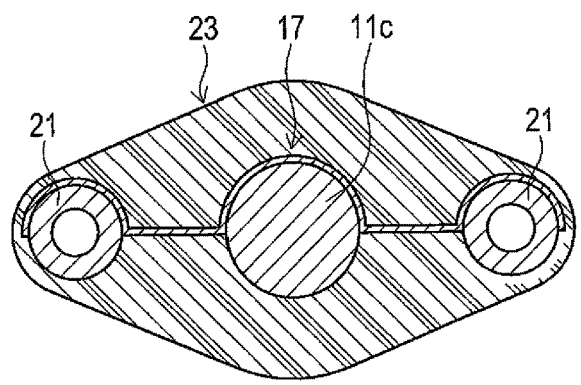

FIGS. 5A, 5B, and 5C are each a cross-sectional view of the molded member 23. FIG. 5A illustrates a cross-section taken along the insertion direction. FIGS. 5B and 5C illustrate cross-sectional surface shapes respectively taken along the lines BB and CC in FIG. 5A. In FIG. 5C, the configuration of the mounting board 17 is partially omitted from the drawing for the sake of illustration.

As illustrated in FIG. 5A, the anchor portion 11c, which is a portion of the conducting bar 11 having a larger diameter than the bolt portion 11a, is molded with an outer end surface 11c2 of the molded member 23 exposed. When the connection is achieved with a terminal of the electronic device on the previous or subsequent stage via the bolt portion 11a, the outer end surface 11c2 functions as a seat portion. Thus, a large contact area can be achieved between the terminal of the electronic device and the conducting bar 11 in the contact state. Thus, the contact resistance can be lowered to reduce the heat emission and the like at the connecting portion in the molded member 23 in which large current flows.

The anchor portion 11c has a diameter W1 larger than a diameter W2 of the center portion 11b. Thus, the anchor portion 11c restricts the relative movement of the conducting bar 11 in the insertion direction with respect to the resin material filling the molded member 23, when external force is applied to move the conducting bar 11 in the insertion direction. For example, the anchor portions 11c in a right side of the figure has an inner end surface 11c1, on a side of the center portion 11b, functioning as an anchor for the external force applied to move the conducting bar 11 toward the left in the figure. Similarly, the anchor portions 11c in a left side of the figure has the inner end surface 11c1, on a side of the center portion 11b, functioning as an anchor for the external force applied to move the conducting bar 11 toward the right in the figure. In this case, the mounting board 17 also functions as a member that restricts the movement in the insertion direction. The anchor portion 11c and the mounting board 17 each have a shape expanding in a direction orthogonal to the insertion direction, as viewed in the insertion direction, unlike the other portions of the conducting bar, and these shapes facing the resin material serve as a resistance against the movement in the insertion direction.

The mounting board 17 restricts the relative movement of the conducting bar 11 in the circumference direction with respect to the resin material filling the molded member 23, when external force of rotating the conducting bar 11 in the circumference direction is applied. For example, the external force is applied to rotate the conducting bar 11 in the circumference direction, when an electronic device is connected to the conducting bar 11, or when vibrations and the like act at the time of use after the connection. As illustrated in FIGS. 5B and 5C, the center portion 11b and the anchor portion 11c of the conducting bar 11 each have a circular cross-sectional shape, and thus are likely to cause the movement of the conducting bar 11 in the circumference direction upon receiving the external force. Still, board surfaces of the first fixing portion 31, the second fixing portions 33, and the connecting portions 35 (FIG. 2) of the mounting board 17 face the resin material filling in the circumference direction as illustrated in FIG. 5C. Thus, because the facing surfaces of the mounting board 17 serve as a resistance against the movement in the circumference direction, the relative movement of the conducting bar 11 in the circumference direction with respect to the resin material filling the molded member 23 is restricted. The second fixing portions 33 of the mounting board 17 are fixed to the seat portions 21, and thus, the seat portions 21 facing the resin material in the circumference direction also serve as a resistance against the movement in the circumference direction, and restrict the relative movement of the conducting bar 11. Furthermore, the mounting board 17 fixed to the anchor portion 11c of the conducting bar 11 is also fixed to the seat portions 21, and thus, when the seat portions 21 are fixed to the metal casing 3, the movement of the conducting bar 11 in the circumference direction is restricted.

Figure 6:
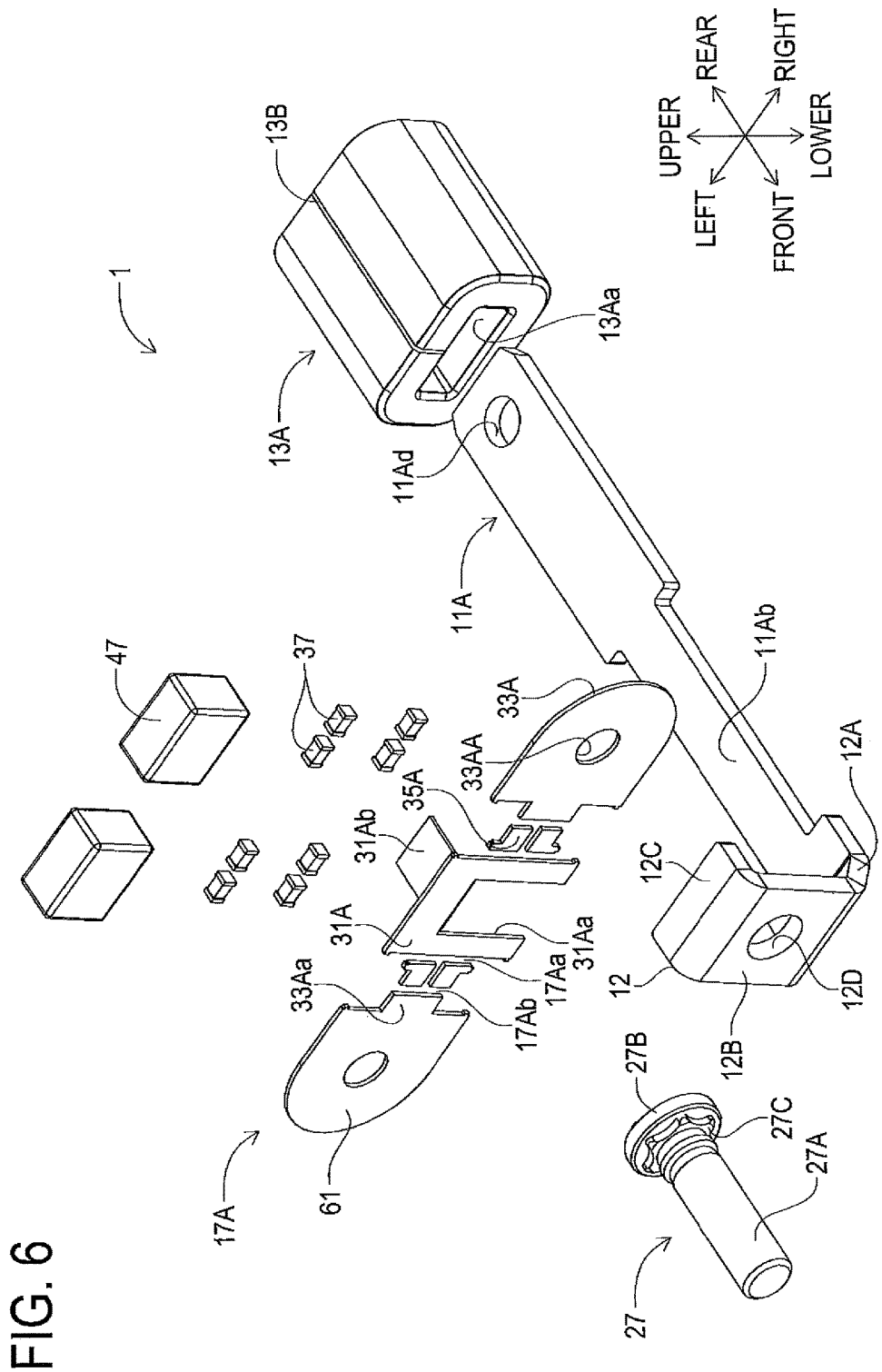
FIG. 6 is an exploded perspective view of a noise filter module in a second embodiment.
Figure 7:
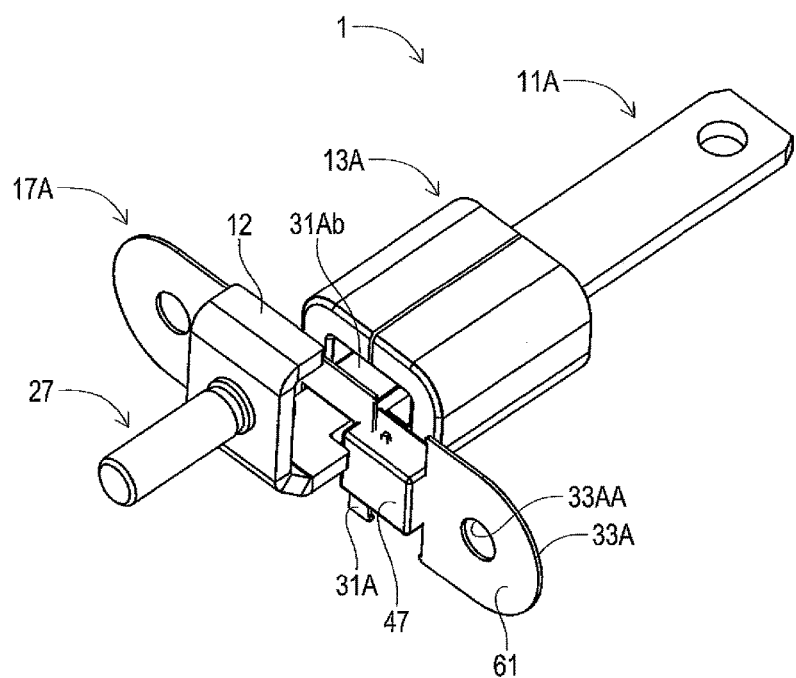
FIG. 7 is a perspective view illustrating a state of the noise filter module in the second embodiment as a result of primary molding.
Figure 8:
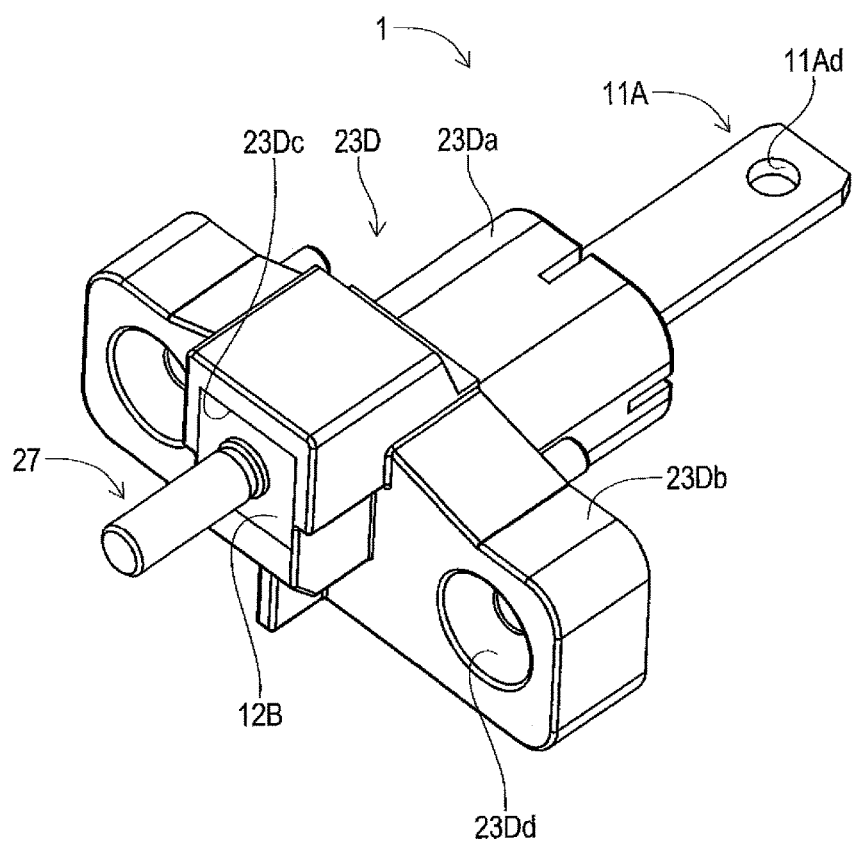
FIG. 8 is a perspective view illustrating a state of the noise filter module in the second embodiment as a result of secondary molding.

Next, a shape/configuration of a noise filter module 1 according to a second embodiment is described. FIG. 6 is an exploded perspective view of the noise filter module 1. FIG. 7 is a perspective view illustrating the noise filter module 1 in a state as a result of primary molding. FIG. 8 is a perspective view illustrating the noise filter module 1 in a state as a result of secondary molding.

As illustrated in FIG. 6, the noise filter module 1 includes a conducting bar 11A, a bolt 27, a magnetic body core 13A, a lead frame 17A, and the like. The output voltage path, connecting between the output terminal VX of the switching power supply 5 and the output terminal VO, mainly includes the conducting bar 11A illustrated in FIG. 6. The conducting bar 11A is formed to have a rectangular plate shape elongated in a single direction. The following description is given with a longitudinal direction of the conducting bar 11A defined as a front and rear direction, a direction orthogonal to a flat plate portion of the conducting bar 11A defined as an upper and lower direction, and a direction orthogonal to the front and rear direction and to the upper and lower direction defined as a left and right direction, as illustrated in FIG. 6. The conducting bar 11A is formed to have a substantially rectangular shape extending in the front and rear direction, as viewed from above.

For example, the conducting bar 11A is made of a metal material such as copper or aluminum. The conducting bar 11A has an end portion on a rear side (right side in FIG. 6) provided with a connection hole 11Ad formed through the upper and lower direction. The conducting bar 11A has the connection hole 11Ad connected to the output terminal VX of the switching power supply 5 disposed in the metal casing 3 illustrated in FIG. 1.

The conducting bar 11A has a bent portion 12 that is on a front side (left side in FIG. 6) and has a distal end portion bent toward the above. The bent portion 12 includes a first curved portion 12A, a bolt connecting portion 12B, and a second curved portion 12C. The first curved portion 12A continues from the distal end portion of the conducting bar 11A, and is curved upward by a predetermined angle. The bolt connecting portion 12B continues from a distal end portion of the first curved portion 12A, and has planes in parallel with the upper and lower direction and the left and right direction. The bolt connecting portion 12B has a center portion provided with an insertion hole 12D formed through the front and rear direction, and the bolt 27 is fixed in the insertion hole 12D. The second curved portion 12C continues from the upper end portion of the bolt connecting portion 12B and is bent rearward by a predetermined angle.

The bolt 27 includes an output terminal portion 27A and a latching portion 27B. The output terminal portion 27A has a circular column shape extending in the front and rear direction, and has an outer circumference surface provided with a male screw (not illustrated) used for fixing to a connection terminal of the auxiliary battery and the like through screwing, In the bolt 27, the latching portion 27B is integrally formed with a rear end surface of the output terminal portion 27A. The latching portion 27B expands in the radial direction from the center axis of the output terminal portion 27A extending along the front and rear direction, to have a disk shape with a larger diameter than the output terminal portion 27A. Thus, the circular latching portion 27B has the center positioned on the center axis of the output terminal portion 27A having the circular column shape.

The latching portion 27B has a surface on the front side (on a side of the output terminal portion 27A) provided with a step portion 27C as a step in the axial direction of the latching portion 27B. The step portion 27C expands to be in a substantially star shape surrounding the output terminal portion 27A, as viewed from the front. The bolt 27 is press fit into the insertion hole 12D in a direction from the rear side of the bolt connecting portion 12B toward the front, and is fixed with the step portion 27C fit in the insertion hole 12D. The bolt 27 and the front surface of the bolt connecting portion 12B exposed from a secondary molded member 23D described later (see FIG. 8) serve as the output terminal VO to be connected to the supplying device on the subsequent stage.

The magnetic body core 13A includes a hollow portion 13Aa formed through the front and rear direction, and thus has a hollow cylindrical shape. For example, the magnetic body core 13A is made of a magnetic material such as ferrite, The magnetic body core 13A has an ellipsoidal shape expanding in the left and right direction, as viewed in the front and rear direction. Thus, the hollow portion 13Aa has the ellipsoidal shape expanding in the left and right direction as viewed in the front and rear direction, to have a larger width than the conducting bar 11A in the left and right direction, whereby the conducting bar 11A can be inserted.

The conducting bar 11A includes a core attachment portion 11Ab with a smaller width in the left and right direction than the width of a portion where the connection hole 11Ad is formed. The core attachment portion 11Ab has a uniform width in the left and right direction, in a section from substantially the center portion of the conducting bar 11A in the front and rear direction to the vicinity of the front end portion. The choke coil L1 (see FIG. 1) is formed with the conducting bar 11A inserted in the hollow portion 13Aa of the magnetic body core 13A in such a manner that the inner side surface of the hollow portion 13Aa faces the core attachment portion 11Ab of the conducting bar 11A.

The magnetic body core 13A has a slit 13B as a notch, in the upper and lower direction, on an upper side one (on the upper side in FIG. 6) of portions opposed to each other in the upper and lower direction. The slit 13B serves as what is known as a core gap, and extends in the front and rear direction while passing through the center portion of the magnetic body core 13A in the left and right direction. With the slit 13B, a partially discontinuous magnetic path is achieved in the circumference direction of the magnetic body core 13A. The magnetic resistance of the magnetic body core 13A can be adjusted by changing the width and the like of the slit 13B, so that the magnetic saturation can be prevented from occurring. In the noise filter module 1, the inductance of the choke coil L1 needed for removing the noise component can be ensured with the magnetic saturation thus prevented by adjusting the width of the slit 13B of the magnetic body core 13A.

The lead frame 17A includes a first fixing portion 31A, connecting portions 35A, and second fixing portions 33A. The lead frame 17A is made of a highly conductive metal material (such as brass or copper for example), The first fixing portion 31A includes: a notch portion 31Aa formed by partially notching a substantially square plate shape member; and a joint portion 31Ab formed by bending the notched portion. The joint portion 31Ab is bent rearward to a position where the plane of the notched portion is orthogonal to the upper and lower direction, The joint portion 31Ab has a rectangular shape as viewed in the upper and lower direction. The notch portion 31Aa is formed in such a manner that opening is formed at the center of a lower end portion. Thus, the first fixing portion 31A has a substantially upside-down U shape with a lower side open as viewed in the front and rear direction. As illustrated in FIG. 7, the lead frame 17A is fixed to the conducting bar 11A, with the lower surface of the joint portion 31Ab fixed to the upper surface of the core attachment portion 11Ab by welding or the like, in a state where the core attachment portion 11Ab is inserted in the notch portion 31Aa of the first fixing portion 31A. The lead frame 17A is electrically connected to the conducting bar 11A via the joint portion 31Ab. The conducting bar 11A has a front end portion of the core attachment portion 11Ab attached to the lead frame 17A and has a rear side attached to the magnetic body core 13A.

The connecting portions 35A couple between the first fixing portion 31A and the second fixing portions 33A, when the chip capacitors 37 are mounted thereon. The connecting portions 35A according to the present embodiment are formed as a pair of pieces that are opposed to each other in the upper and lower direction and is disposed on each of left and right sides of the first fixing portion 31A. The chip capacitors 37 are mounted on an end portion of each connecting portion 35A on the inner side in the left and right direction and a corresponding one of end portions of the first fixing portion 31A on the outer side in the left and right direction, with a board slit 17Aa provided between the end portions. Similarly, the chip capacitors 37 are mounted on an end portion of each connecting portion 35A on the outer side in the left and right direction and an end portion of the second fixing portion 33A on the inner side, with the board slit 17Ab provided between the end portions.

Thus, the four chip capacitors 37 are mounted between each of the second fixing portions 33A, opposing each other in the left and right direction, and the first fixing portion 31A. The four chip capacitors 37 are two pairs of two chip capacitors 37, connected in series, mounted in parallel. The bent portion 12 and the bolt 27 form the output terminal VO (see FIG. 1). The ground potential GND is supplied to the second fixing portions 33A via a fastening member (such as a bolt) fastened to the metal casing 3 for the switching power supply 5 described later by screwing. Thus, the chip capacitors 37 form the capacitor C1 (FIG. 1).

The second fixing portions 33A are each formed to have a plate shape with a plane orthogonal to the front and rear direction, and each have an end portion on the inner side in the left and right direction provided with a protruding portion 33Aa protruding inward, and the chip capacitors 37 are mounted on the protruding portion 33Aa. The second fixing portions 33A each have an arch-shaped end portion on the outer side in the left and right direction. The second fixing portions 33A each have a fixing hole 33AA into which an unillustrated bolt or the like is inserted into in the front and rear direction to fix the secondary molded member 23D (see FIG. 8) of the encapsulated noise filter module 1 to the metal casing 3. The second fixing portions 33A are each fixed with the fastening member, such as the bolt inserted in the fixing hole 33AA, fastened to an attachment portion of the metal casing 3.

For example, the lead frame 17A can be formed through the following steps. First of all, a flat metal plate is punched by a punching process and the like, whereby members that are supposed to be the first fixing portion 31A, the connecting portions 35A, and the second fixing portions 33A are formed in a state of being bridged by thin metal wires. Then, the chip capacitors 37 are mounted by soldering and the like. Next, parts of the first fixing portion 31A and the second fixing portions 33A, as well as the chip capacitors 37 and the connecting portions 35A are encapsulated with an insulating material such as a resin material, whereby a primary molded member 47 is formed. The resin material used for the primary molded member 47 includes phenol resin, epoxy resin, unsaturated polyester, and the like. The parts of the first fixing portion 31A and the second fixing portions 33A, as well as the chip capacitors 37 and the connecting portions 35A have their relative positions fixed with the primary molded member 47 thus formed. Then, the bridging portions of the thin metal wires are cut, whereby the lead frame 17A illustrated in FIG. 7 is formed.

FIG. 8 illustrates the secondary molded member 23D obtained by further encapsulating the noise filter module 1 with thermoset resin, after the primary molded member 47 illustrated in FIG. 7 is formed. The secondary molded member 23D includes: a core molded member 23Da that entirely encapsulates an outer circumference surface of the magnetic body core 13A; and a frame molded member 23Db that entirely encapsulates the lead frame 17A with the primary molded member 47 formed, by insert molding for example. Thus, a resin material applying no excessive pressure to the magnetic body core 13A such as phenol resin is used as the thermoset resin used for forming the secondary molded member 23D.

The bolt 27 protrudes from a front side end surface of the frame molded member 23Db, and an opening 23Dc from which the front side surface of the bolt connecting portion 12B provided in the bent portion 12 is exposed is formed in the frame molded member 23Db. A fixing hole 23Dd is formed through the frame molded member 23Db in the front and rear direction, at a position corresponding to the fixing hole 33AA (see FIG. 6) of the second fixing portion 33A, and the fastening member such as a bolt is inserted in the fixing hole 23Dd. The bolt or the like is fastened while being in direct contact with an exposed part of the second fixing portions 33A. Thus, the fixing hole 23Dd has an inner diameter defining an opening size large enough not to cause contact and interference between the inner circumference surface of the fixing hole 23Dd and the bolt and the like for the fastening. For example, the metal casing 3 (see FIG. 1) is provided with a protruding portion protruding forward at a position corresponding to the fixing hole 23Dd, and the attachment portion where the bolt or the like is fastened is formed at the protruding portion. In the noise filter module 1, the protruding portion of the metal casing 3 is inserted in the fixing hole 23Dd of the secondary molded member 23D from the rear side, and the bolt inserted from the front side is fastened for fixing, in a state where the protruding portion is in close contact with the second fixing portions 33A exposed from the fixing hole 23Dd.

Figure 9:
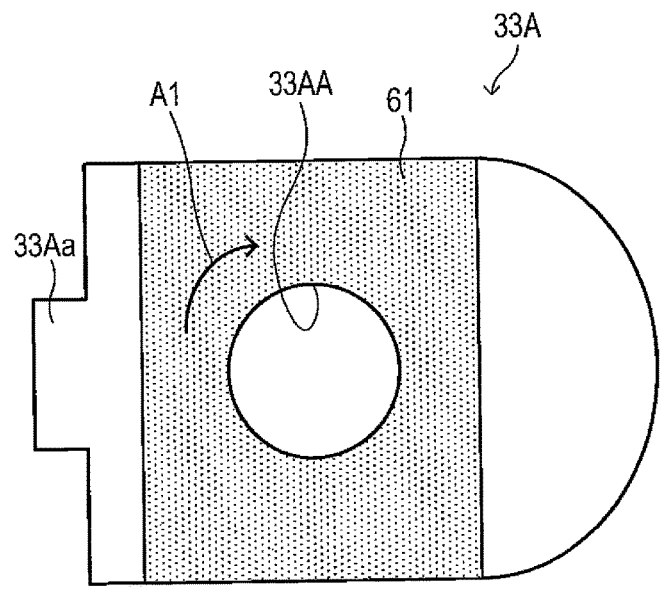
FIG. 9 is a plan view of a second fixing portion in the second embodiment.

FIG. 9 is a plan view of each of the second fixing portions 33A. In the second fixing portion 33A, when the bolt or the like inserted in the fixing hole 23Dd is fastened as described above, rotational torque acts in a direction in which the bolt is rotated (a direction indicated by arrow A1 in FIG. 9 for example). The second fixing portion 33A according to the present embodiment has a recess and protrusion portion 61, illustrated as a hatched portion in FIG. 9, as a surface provided with a plurality of recesses and protrusions. The recess and protrusion portion 61 is formed on each of both front and rear surfaces of the second fixing portion 33A. With the recess and protrusion portions 61 formed on the second fixing portion 33A, a large contact area is achieved between the second fixing portion 33A and the resin on an inner side portion of the frame molded member 23Db encapsulating the second fixing portion 33A. Thus, the resistance (frictional force) against the rotational torque as a result of rotating the bolt can be increased in the second fixing portion 33A.

As a result, a defect such as deformation of the second fixing portion 33A and the like due to the application of excessive force at the time of fastening is less likely to occur. Furthermore, the lead frame 17A including the second fixing portion 33A and the frame molded member 23Db encapsulating the lead frame 17A can be prevented from separating from each other due to the application of the excessive rotational torque.

Figure 10:
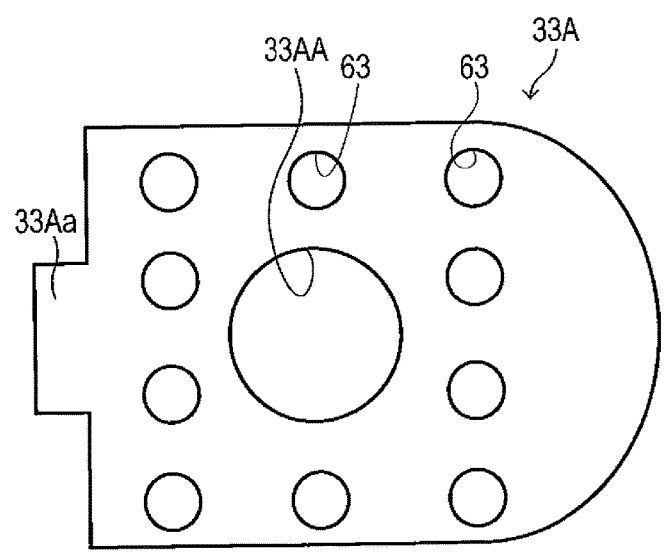
FIG. 10 is a plan view of another example of the second fixing portion in the second embodiment.

A result of the process to achieve a large resistance against the rotational torque is not limited to the recess and protrusion form described above. For example, a plurality of introduction holes 63 may be formed through the second fixing portion 33A as processed portions as illustrated in FIG. 10. The introduction holes 63 each have a circular shape and are formed through the second fixing portion 33A in the front and rear direction, The thermoset resin is introduced into the introduction holes 63 when the frame molded member 23Db (secondary molded member 23D) is formed by insert molding and the like. Thus, in the frame molded member 23Db, the resin for encapsulating the front surface of the second fixing portion 33A and the resin for encapsulating the rear surface are in communication with each other through the plurality of introduction holes 63, and thus, secure fixing to the second fixing portion 33A can be achieved, whereby the large resistance against the rotational torque is achieved. Thus, the effect similar to that provided by the recess and protrusion portion 61 described above can be achieved with this configuration.

Figure 11:
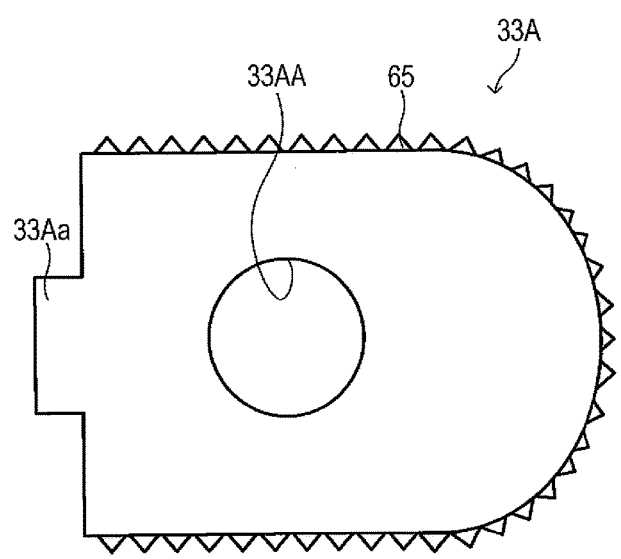
FIG. 11 is a plan view of still another example of the second fixing portion in the second embodiment.

For example, as illustrated in FIG. 11, an engagement portion 65 having a saw-tooth shape with triangular waves as the processed portion may be formed along the outer circumference of the second fixing portion 33A. When the rotational torque due to the rotation of the bolt is applied to the second fixing portion 33A, the engagement portion 65 formed on the outer circumference portion engages with the frame molded member 23Db in a rotational direction, whereby a large resistance in the rotational direction can be achieved. Thus, the effect similar to that provided by the recess and protrusion portion 61 described above can be achieved also with this configuration.

Next, how the chip capacitors 37 are mounted is described. As described above, the noise filter module 1 according to the present embodiment has what is known as an LC filter structure with the choke coil L1 disposed on the output voltage path connecting between the output terminal VX of the switching power supply 5 and the output terminal VO, and the capacitor CI connected between the output terminal VO and the ground potential GND, as illustrated in FIG. 1. The capacitor C1 is formed of the chip capacitors 37 illustrated in FIG. 6. The chip capacitors 37 are mounted on the surfaces of the connecting portions 35A, the first fixing portion 31A, and the second fixing portions 33A, and connect between these members. Thus, the LC filter circuit, including the choke coil L1 and the capacitor C1, has the chip capacitors 37 mounted on the surfaces of the connecting portions 35A and the like, so that a lead can be omitted to achieve a short connection distance, whereby equivalent series inductance (ESL) can be lowered. As a result, the choke coil L1 can be downsized, and thus the noise filter module 1 as a whole can be downsized. Thus, the noise filter module 1 can be downsized, with its desired filtering performance in a frequency band of an on-vehicle AM radio receiver and the like maintained. For example, the inductance of the choke coil L1 is 200 nH or more. The ESL is 25 nH or less.

Figure 12:
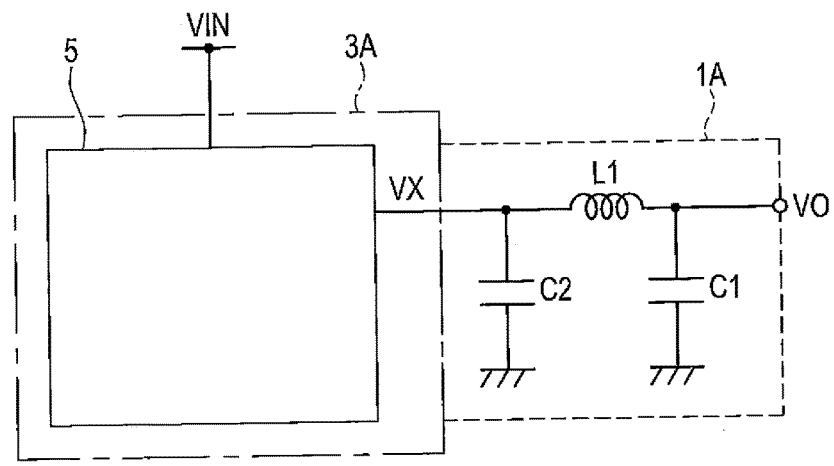
FIG. 12 is a circuit diagram illustrating a state where a it filter module, as one example of an output-noise reduction device according to a third embodiment, is connected to a switching power supply.

FIG. 12 is a circuit diagram according to a third embodiment of the present application. Here, a case is described where a π filter module 1A as one example of the output-noise reduction device is provided instead of the noise filter module 1 (see FIG. 1) according to the first embodiment. The π filter module 1A is obtained by adding a capacitor C2 in the module to the configuration of the noise filter module 1 according to the first embodiment. The configurations similar to those in the first embodiment are denoted with the same reference numerals, and will not be described below.

The π filter module 1A is connected to the output terminal VX of the switching power supply 5, as in the case of the noise filter module 1. The π filter module 1A includes the choke coil L1 disposed on the output voltage path connecting between the output terminal VX and the output terminal VO, and further includes the capacitors C1 and C2 each provided between the ground potential GND and a corresponding one of terminals of the choke coil L1. The choke coil L1 and the capacitors C1 and C2 are positioned outside a metal casing 3A.

The π filter module 1A according to the third embodiment prevents the radiation noise and the conductive noise, due to the switching operation of the switching power supply 5, from being transmitted to the output terminal VO, as in the case of the noise filter module 1 according to the first embodiment.

In the choke coil L1 as a component of the π filter module 1A, portions of the conducting bar 11 protruding from both ends of the magnetic body core 13 are disposed outside the metal casing 3A, and electromagnetic coupling to these portions is prevented by the electromagnetic shielding effect of the metal casing 3A. As a result, the radiation noise can be prevented from being transmitted to these portions of the conducting bar 11.

The radiation noise due to electromagnetic coupling is also prevented from being transmitted to the capacitors C1 and C2 as components of the π filter module 1A. This is because the electromagnetic coupling to the capacitors C1 and C2 outside the metal casing 3A is prevented by the electromagnetic shielding effect of the metal casing 3A. In addition, the voltage fluctuation is prevented from being transmitted in a circumventing manner through the ground potential GND. This is because the ground potential GND is supplied to the capacitors C1 and C2 from the metal casing 3A via the seat portions 21, and the metal casing 3A has a shape of a wide plate to have sufficiently low impedance to prevent the voltage fluctuation from mixing into the ground potential GND to be supplied, whereby the stable ground potential GND with conductive noise prevented can be maintained.

Thus, the radiation noise and the conductive noise, due to the switching operation of the switching power supply 5, can both be prevented from being transmitted to the output terminal VO, whereby the noise can be prevented from being transmitted to the output voltage.

Figure 13:
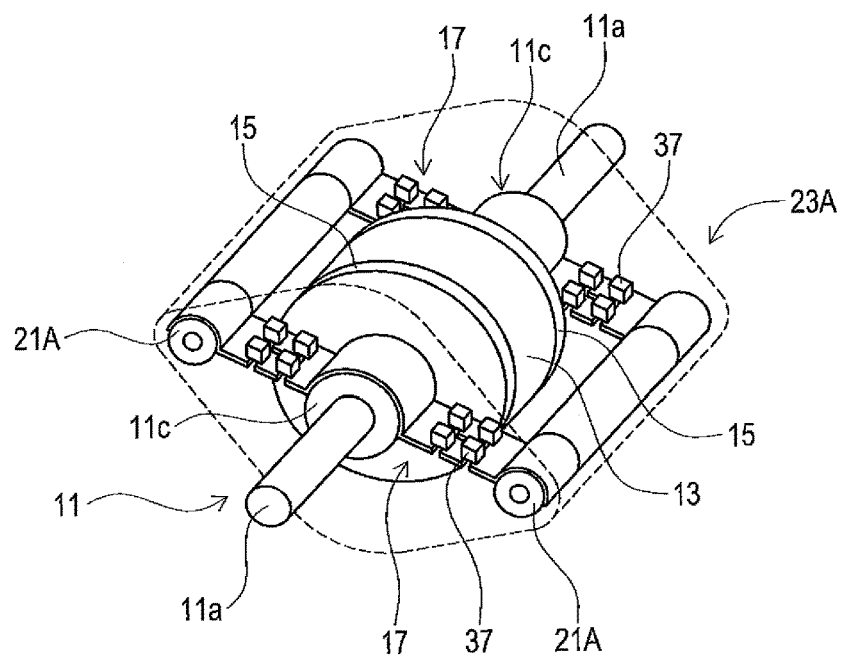
FIG. 13 is a see-through perspective view illustrating the inside of the it filter module in the third embodiment.

Next, a shape/structure defining the module configuration of the π filter module 1A will be described. FIG. 13 is a see-through perspective view of the π filter module 1A encapsulated with resin, illustrating its internal configuration. Configurations similar to those in the first embodiment are denoted with the same reference numerals, and will not be described below. The configuration of the mounting board 17 is partially omitted from the drawing, for the sake of illustration.

In the third embodiment, two mounting boards 17 are provided, unlike in the first embodiment where only one mounting board 17 is provided. More specifically, the mounting board 17 (the mounting board in the first embodiment) is fixed on the outer circumference surface of the outer side one of the two anchor portions 11c of the conducting bar 11, and is also fixed to an outer circumference surface of the inner side one of the anchor portions 11c. The chip capacitors 37 mounted on the inner side one of the mounting boards 17 form the capacitor C2 (see FIG. 12), whereas the chip capacitors 37 mounted on the outer side one of the mounting boards 17 form the capacitor C1 (see FIG. 12).

A molded member 23A has a shape in which the flange portion 23b (see FIG. 3A) extends in the axial direction instead of the core portion 23a (see FIG. 3A) in the molded member 23 according to the first embodiment. More specifically, a rectangular column shape is obtained with seat portions 21A and the anchor portion 11c, at the inner and outer portions and formed through both end surfaces, each having end surfaces exposed from the end surfaces of the molded member 23A.

The π filter module 1A is formed with the molded member 23A screwed onto the metal casing 3A, with screws, bolts, or the like inserted in the openings of the seat portions 21A in a state where the rear side of exposed end surfaces of the seat portions 21A are in close contact with the outer end surface of the metal casing 3A. The molded member 23A is disposed outside the metal casing 3A. The bolt portion 11a protruding from the molded member 23A at a portion on the rear side of the conducting bar 11 is inserted into the casing through the opening (not illustrated) of the metal casing 3A. The opening in the metal casing 3A has a smaller diameter than a casing opening 30 of the metal casing 3 (see FIG. 4). This is because, unlike in the first embodiment where the core portion 23a including the magnetic body core 13 is inserted into the metal casing 3, only the bolt portion 11a protruding from the molded member 23A needs to be inserted in the third embodiment.

The molded member 23A is entirely disposed outside the metal casing 3A. This means that the encapsulated members are also disposed outside the metal casing 3A. The encapsulated members include the portions of the conducting bar 11 protruding from both end portions of the magnetic body core 13 as a component of the choke coil L1 and the chip capacitors 37 forming the capacitors C1 and C2. This prevents the electromagnetic coupling from the inside of the metal casing 3A to the portions of the conducting bar 11 on both ends of the choke coil L1 and the capacitors C1 and C2. Thus, the radiation noise due to the electromagnetic coupling can be prevented from being transmitted to the output terminal VO (bolt portion 11a).

When the π filter module 1A is mounted, the π filter module 1A is fixed with the rear side end surfaces of the seat portions 21A in close contact with the outer end surface of the metal casing 3A. Thus, the capacitors C1 and C2 are connected to the ground potential GND via the seat portions 21A and the metal casing 3A. The metal casing 3A achieves the stable ground potential GND, and thus the voltage fluctuation is prevented from reaching the output terminal VO in a circumventing manner through the ground potential GND via the capacitors C1 and C2. Thus, the conductive noise is prevented from being transmitted to the output terminal VO (bolt portion 11a) due to the voltage fluctuation transmitted in a circumventing manner.

As in the first embodiment, the anchor portion 11c restricts the relative movement of the conducting bar 11 in the insertion direction with respect to the resin material filling the molded member 23A due to the application of the external force in the insertion direction to the conducting bar 11. As in the first embodiment, the mounting board 17 also functions as the member for restricting the movement in the insertion direction. In the third embodiment, the movement in the insertion direction is more effectively prevented compared with the first embodiment, because the two mounting boards 17 are provided on both end portions in the insertion direction.

As in the first embodiment, the mounting board 17 prevents the relative movement of the conducting bar 11 in the circumference direction with respect to the resin material filling the molded member 23A due to the application of the external force in the circumference direction to the conducting bar 11. In the third embodiment, the movement in the circumference direction is more effectively prevented compared with the first embodiment, because the two mounting boards 17 are provided on both end portions in the insertion direction.

The thickness of the molded member 23A, protruding outward from the metal casing 3A, is a sum of thicknesses of the core portion 23a and the flange portion 23b in the molded member 23 in the first embodiment. This thickness of the molded member 23A protruding outward from the metal casing 3A is insignificant, considering the size of the metal casing 3A accommodating the electronic device such as the switching power supply 5, as in the first embodiment. There is even an advantage that the increase in the package volume is smaller than the configuration in which the π filter module 1A is incorporated in the metal casing 3A.

Figure 14:
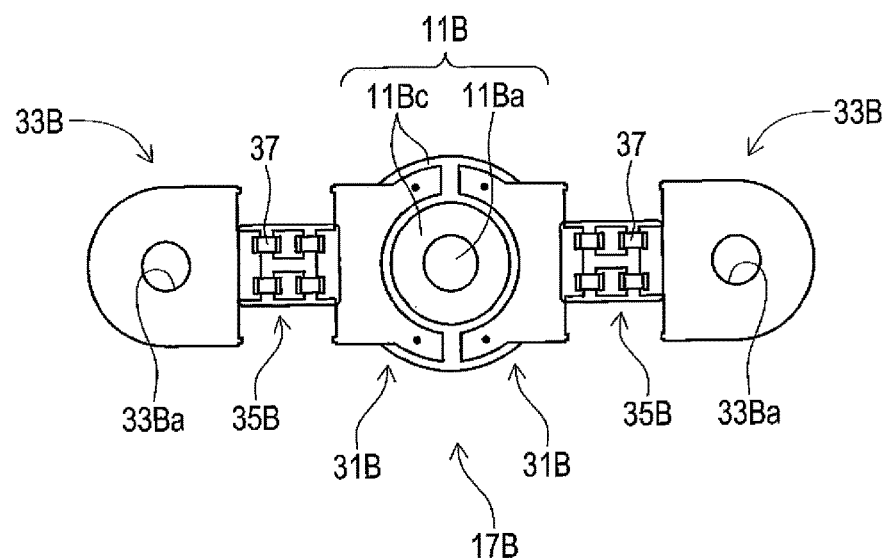
FIG. 14 is a diagram illustrating a mounting board in a fourth embodiment.
Figure 15:
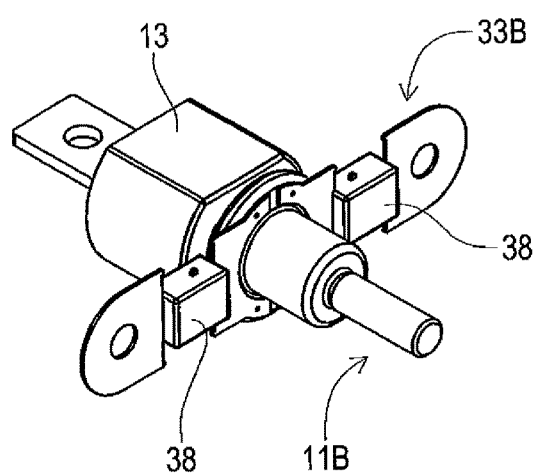
FIG. 15 is a perspective view illustrating an internal structure of a noise filter module in the fourth embodiment.
Figure 16:
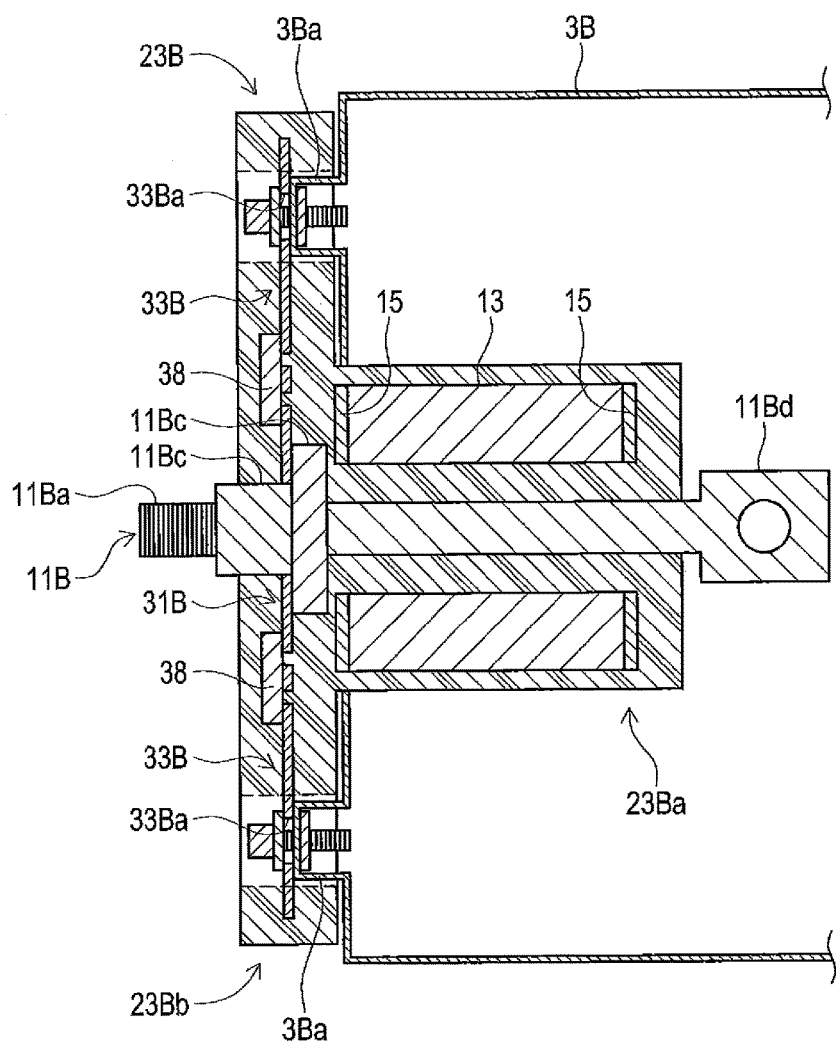
FIG. 16 is a cross-sectional view illustrating a state where the noise filter module in the fourth embodiment is assembled to a metal casing.
Figure 17:
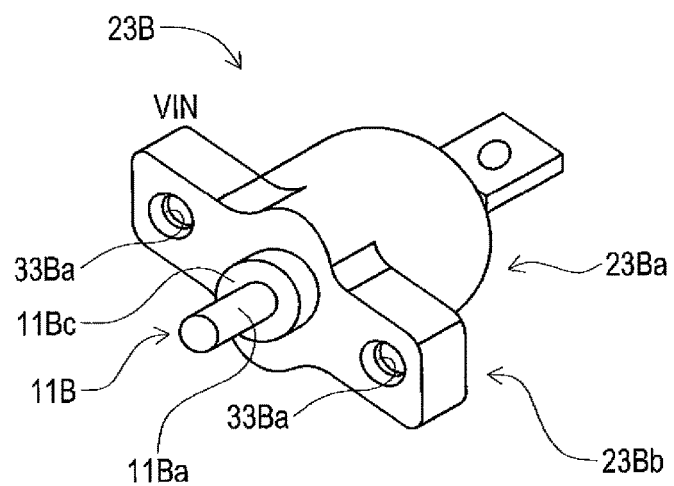
FIG. 17 is a perspective view of the noise filter module in the fourth embodiment.

FIG. 14 illustrates a configuration of a noise filter module 1 according to a fourth embodiment of the present application. Here, the circuit configuration is the same as that of the noise filter module 1 in the first embodiment (see FIG. 1), but the shape/structure is different. FIG. 14 illustrates a configuration of a mounting board 17B as viewed in an attachment direction to a metal casing 3B, FIG. 15 is a perspective view illustrating an internal configuration after the assembly. FIG. 16 illustrates a cross-sectional view illustrating a configuration in a state of being attached to the metal casing 3B. FIG. 17 is a perspective view of the noise filter module I in a state as a result of molding. The configurations that are the same as those in the first embodiment are denoted with the same reference numerals as those in the first embodiment, and will not be described below.

As illustrated in FIG. 14, the mounting board 17B has a shape different from that of the mounting board 17 in the first embodiment. Each of first fixing portions 31B, second fixing portions 33B, and connecting portions 35B has a shape of a flat plate, and is made of a highly conductive metal material (such as brass or copper, for example). The mounting board 17B has a symmetrical shape about the first fixing portion 31B in the left and right direction. The first fixing portions 31B each have a distal end portion covering a corresponding one of left and right semicircular surfaces of outer end surfaces of an anchor portion 11Bc of a conducting bar 11B and having a semicircular notch. The anchor portion 11Bc has a shape defined by two stacked circular columns with different diameters including: a smaller diameter circular column on the outer side in the insertion direction; and a larger diameter circular column on the inner side. The first fixing portions 31B cover and are fixed by spot welding and the like (as indicated by black points on the first fixing portion 31B) to the outer end surface of the larger diameter circular column of the anchor portion 11Bc. On the inner diameter side of the semicircular first fixing portions 31B, the smaller diameter circular column of the anchor portion 11Bc and a bolt portion 11Ba with an even smaller diameter protrude outward in the insertion direction. The second fixing portion 33B has a through hole 33Ba into which the bolt or the like is inserted for the attachment to the metal casing 3B. The connecting portion 35B has the same configuration as the connecting portion 35 in the first embodiment. Thus, the connecting portion 35B has a rectangular plate shape segmented for each chip capacitor 37 and is disposed between the first fixing portion 31B and a corresponding one of the second fixing portions 33B, and the chip capacitors 37 are mounted thereon. In FIGS. 15 and 16, the chip capacitors 37 are mounted and then are molded by resin so that a primary molded member 38 is formed.

As illustrated in FIG. 16, the conducting bar 11B is different from the conducting bar 11 in the first embodiment in that the anchor portion is not provided on the inner side, and that a terminal portion 11Bb is provided instead of the bolt portion 11a on the inner side. The terminal portion 11Bd has a rectangular shape in a form of a wide flat plate, with a connection hole provided at the center portion. As in the first embodiment, the conducting bar 11B is inserted through the magnetic body core 13 and the electromagnetic shielding plates 15. The electromagnetic shielding plates 15 are disposed on both end surfaces of the magnetic body core 13.

The mounting board 17B encapsulated by a molded member 23B is screwed onto the metal casing 3B by a bolt or the like to be attached. The metal casing 3B includes casing protruding portions 3Ba, of which the positons and the diameters match those of the through holes 33Ba of the mounting board 17B, protruding outward to be in close contact with the second fixing portions 33B. The molded member 23B has both end surfaces each provided with an opening so that the through hole 33Ba and the second fixing portion 33B around the through hole 33Ba are exposed. Thus, the second fixing portions 33B of the mounting board 17B are attached while being in close contact with the metal casing 3B at the casing protruding portions 3Ba. The diameter of the opening is large enough to prevent the bolt or the like for the screwing and the casing protruding portion 3Ba from interfering with the flange portion 23Bb. The casing protruding portions 3Ba are inserted in the opening of the molded members 23B and are screwed on while being in close contact with the exposed second fixing portions 33B. Other general fixing method other than screwing, such as caulking and welding, may be employed for the attaching.

As illustrated in FIG. 17, the molded member 23B includes a core portion 23Ba and a flange portion 23Bb. The core portion 23Ba is molded in such a manner as to encapsulate the magnetic body core 13, through which the conducting bar 11B is inserted, together with the conducting bar 11B, and to have a cylindrical shape having the axis extending in the insertion direction. The flange portion 23Bb is molded in such a manner as to encapsulate the anchor portion 11Bc of the conducting bar 11B and the mounting board 17B, and to have a rectangular surface shape orthogonal to the insertion direction. As in the first embodiment (see FIG. 4), the magnetic body core 13 has the conducting bar 11B (output terminal VO), protruding from the outer side end portion, molded in the flange portion 23Bb in such a manner as to protrude outside the metal casing 3B. A part of the smaller diameter circular column of the anchor portion 11Bc and the bolt portion 11Ba protrude from the outer side end portion of the flange portion 23Bb.

The chip capacitors 37 (capacitor C1) are encapsulated in the flange portion 23Bb. The flange portion 23Bb is disposed outside the metal casing 3B. Thus, the conducting bar 11B (output terminal VO), protruding from the outer side end portion of the magnetic body core 13, and the chip capacitors 37 (capacitor C1) are disposed outside the metal casing 3B. As a result, the electromagnetic coupling from the inner side of the metal casing 3B to the conducting bar 11B (output terminal VO) and the chip capacitors 37 (capacitor C1) is prevented. The ground potential GND connected to the chip capacitors 37 (capacitor C1) is supplied from the metal casing 3B. Thus, the voltage fluctuation is prevented from being transmitted to the chip capacitors 37 (capacitor C1) in a circumventing manner via the ground potential GND. All things considered, both radiation noise and conductive noise can be prevented from reaching the output terminal VO.

The noise filter module 1 in the fourth embodiment is different from the first embodiment in that the seat portions 21 can be omitted. In the steps for forming the mounting board 17B, the step for molding each of the first fixing portion 31 and the second fixing portions 33 into the arch shape, performed in the first embodiment, can be omitted, whereby a manufacturing cost can be reduced.

As in the first embodiment, the relative movement of the conducting bar 11B in the insertion direction and the circumference direction is restricted. This is because the conducting bar 11B includes the anchor portion 11Bc with a larger diameter than the bolt portion 11Ba, and thus has a shape different from other portions, as viewed in the insertion direction. The mounting board 17B also prevents the relative movement of the conducting bar 11B in the insertion direction and the circumference direction. This is because the mounting board 17B has such a shape to serve as a resistance against the movement in each of the insertion direction and the circumference direction, as viewed in these directions. This is also because the mounting board 17B is fixed to the metal casing 3B to restrict the movement of the conducting bar 11B in the circumference direction.

Figure 18:
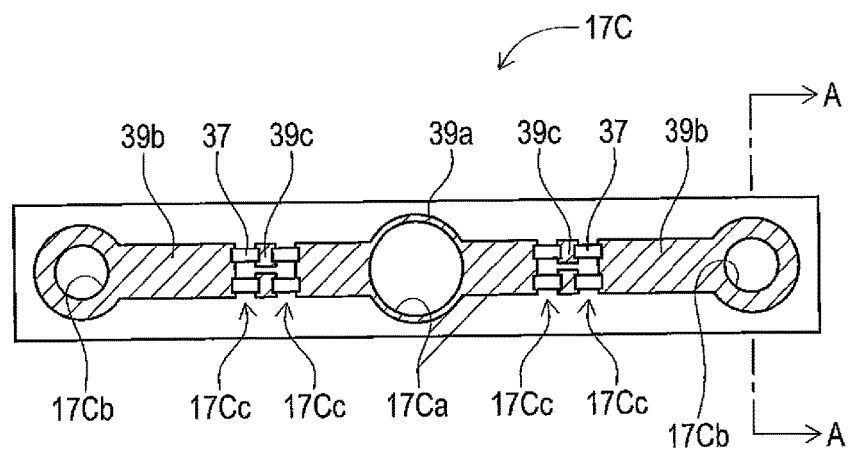
FIG. 18 is a diagram illustrating a mounting board in a fifth embodiment.

FIG. 18 illustrates a configuration of a noise filter module 1 according to a fifth embodiment of the present application. Here, the circuit configuration is the same as the noise filter module 1 in the first embodiment (see FIG. 1), but the shape/structure is different. FIG. 18 illustrates a structure of a mounting board 17C as viewed in an attaching direction to the metal casing 3. For example, print wiring made of copper and the like is formed on a hard and rectangular printed board obtained by processing epoxy resin and the like. A through hole 17Ca, through which the bolt portion 11a of the conducting bar 11 is inserted, is formed at the center. Through holes 17Cb, through which the seat portions 21 are inserted, are formed on left and right sides of the through hole 17Ca.

The mounting board 17C has a surface provided with conducting wiring 39a, conducting wiring 39b, and conducting wiring 39c. The conducting wiring 39a surrounds the outer circumference of the through hole 17Ca and extends from the through hole 17Ca toward the through holes 17Cb on the left and the right sides. The conducting wiring 39b surrounds the outer circumference of the through holes 17Cb, and extends from the through holes 17Cb towards the through hole 17Ca. The conducting wiring 39c is disposed between the conducting wiring 39a and the conducting wiring 39b. As exemplarily described with reference to a cross-sectional view of the through holes 17Cb in FIG. 19, conducting wiring 39d is formed on a back surface of the mounting board 17C, and surrounds the outer circumference of the through holes 17Ca and 17Cb. A board slit 17Cc is formed between the conducting wiring 39a and the conducting wiring 39c, and between the conducting wiring 39b and the conducting wiring 39c. The chip capacitors 37 are mounted between the conducting wiring 39a and the conducting wiring 39c, and between the conducting wiring 39b and the conducting wiring 39c, with the board slits 17Cc provided between pieces of the wiring. A land area, on which the chip capacitors 37 are mounted by soldering, is formed by the conducting wiring 39a and the conducting wiring 39c with the board slit 17Cc provided in between, and by the conducting wiring 39b and the conducting wiring 39c with the board slit 17Cc provided in between. The two pairs of two chip capacitors 37 connected in series are connected in parallel in an area between the conducting wiring 39a and the conducting wiring 39b.

Figure 19:
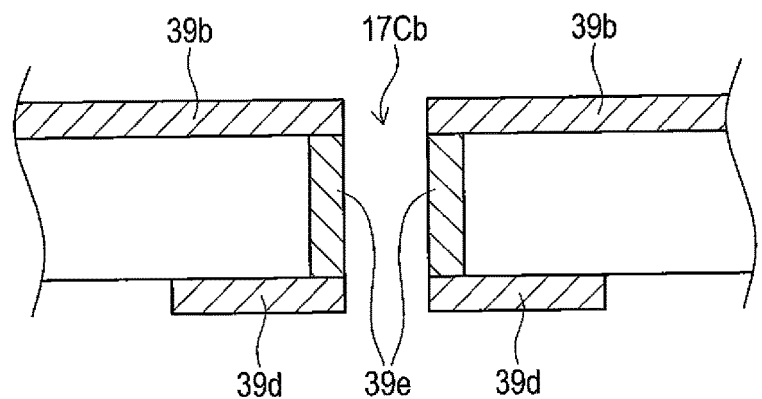
FIG. 19 is a schematic cross-sectional view of the mounting board in the fifth embodiment taken along line AA.

FIG. 19 is a cross-sectional view of the through holes 17Cb taken along line AA. Cylindrical conducting wiring 39e is formed to cover the inner side surface of the through holes 17Cb. The cylindrical conducting wiring 39e is connected to the conducting wiring 39b on the front surface and the conducting wiring 39d on the back surface of the mounting board 17C. Although not elaborated in the figure, the through hole 17Ca also has the inner side surface covered with the cylindrical conductive wire connected to the conducting wiring 39a on the front surface and the conducting wiring 39d on the back surface of the mounting board 17C. The conducting bar 11 is fit and fixed in the through hole 17Ca. The seat portions 21 are fit and fixed in the respective through holes 17Cb. The conducting bar 11 and the seat portions 21 thus fit are each connected to a corresponding one of the conducting wiring 39a and the conducting wirings 39b on the front surface of the mounting board 17C, and to the conducting wirings 39d on the back surface, by soldering and the like. Thus, secure fixing and sufficient conductivity can both be achieved. Here, the anchor portion 11c of the conducting bar 11 has an outer side end surface in close contact with the mounting board 17C. A general fixing method other than press fitting, such as caulking or welding, may be employed for attaching the conducting bar 11 and the seat portions 21 to the through holes 17Ca and 17Cb.

The other configurations are the same as those in the first embodiment. More specifically, the magnetic body core 13 and the electromagnetic shielding plate 15 are attached to the conducting bar 11 to which the mounting board 17C is fixed, the entire structure is encapsulated by molding, and the molded member obtained by the molding is attached to the metal casing. Thus, the effects similar to those in the first embodiment can be obtained. More specifically, the radiation noise and the conductive noise, due to the electromagnetic coupling such as capacitive coupling and inductive coupling and due to the route of the ground wiring, are prevented from being transmitted to the mounting board 17C and the conducting bar (output terminal VO) so that the noise is reduced, and the mounting board 17C is provided so that the movement of the conducting bar 11 in the circumference direction and the insertion direction can be restricted.

In the mounting board 17C in the fifth embodiment, the cylindrical conducting wiring 39e is formed as metal covering the inner side surface of the through holes 17Cb, and is connected to the conducting wiring 39b and the conducting wiring 39d respectively on the front and the back surfaces of the mounting board 17C. Thus, when the seat portions 21 are inserted in the through holes 17Cb, the seat portions 21 are connected to the conducting wiring 39b and the conducting wiring 39d respectively on the front and the back surfaces of the mounting board 17C and thus the conduction is established therebetween. The same applies to the through hole 17Ca. More specifically, the cylindrical conducting wiring covering the inner side surface of the through hole 17Ca connects between the conducting wiring on the front surface and the conducting wiring on the back surface of the mounting board 17C, whereby the conduction can be achieved between the conducting bar 11 and the front and the back surfaces of the mounting board 17C. Thus, one end of the chip capacitors 37 connected in series with the conducting bar 11 is connected with the other end of the chip capacitors 37 connected in series with the seat portions 21. All things considered, the chip capacitors 37 connected in series can be connected between the output terminal VO and the ground potential GND.

When the inner side surface of the through hole is not covered with the cylindrical conductive wiring, the conduction is unable to be achieved with the conducting wiring 39b and the conducting wiring 39d by simply inserting the seat portion 21 in the through hole 17Cb. Thus, flange portions with an increased diameter have been provided at portions of the seat portion protruding from the front and the back surfaces of the through hole in a state where the seat portion is inserted in the board from the through hole, so that the conduction with the conducting wiring 39b and the conducting wiring 39d respectively on the front and the back surfaces of the mounting board 17C is achieved with the flange portions. The flange portions on both ends of the seat portion are only achievable when the seat portion has the two part structure with a bolt shaped member and nut shaped members. Thus, this structure involves a larger number of parts. Furthermore, the assembling involves a cumbersome process of inserting the bolt shaped member into the through hole and then coupling the nut shaped members to the bolt shaped member.

In the fifth embodiment, the connection and the conduction with the conducting wiring 39b and the conducting wiring 39d respectively on the front and the back surfaces of the mounting board 17C can be achieved, simply by inserting the seat portions 21 having the circular column shape into the through holes 17Cb. Thus, attempts to reduce the number of parts and achieve more efficient assembling work can be facilitated.

Furthermore, the cylindrical conducting wiring is formed by covering the entire inner side surface of each of the through holes 17Ca and 17Cb with metal. Thus, the contact resistance can be lowered with sufficient contact area secured for achieving conduction with the conducting bar 11 and the seat portions 21.

The noise filter module 1 in the fifth embodiment includes a single mounting board 17C, and thus can achieve smaller number of parts and assembly steps, compared with the first embodiment, whereby the manufacturing cost can be reduced.

Figure 20:
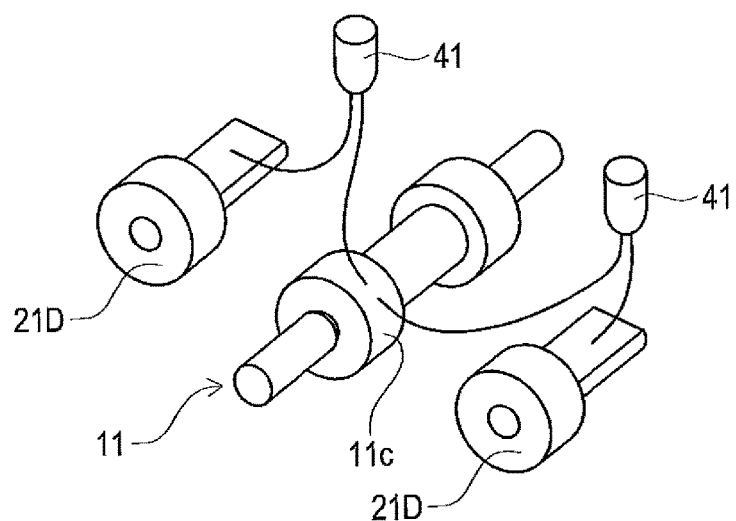
FIG. 20 is an exploded perspective view of a noise filter module in a sixth embodiment.

FIG. 20 illustrates a configuration of a noise filter module 1 in a sixth embodiment according to the present application. The circuit configuration is the same as that of the noise filter module 1 in the first embodiment (see FIG. 1), but the shape/structure is different. More specifically, the mounting board 17 in the first embodiment is not provided, lead type capacitors 41, such as film capacitors or laminated ceramic capacitors for example, are provided instead of the chip capacitors 37, and seat portions 21D are provided instead of the seat portions 21. The lead type capacitor 41 is a general capacitor element with a lead wire serving as a terminal.

FIG. 20 is an exploded perspective view. The seat portion 21D is a metal member processed to be in a cylindrical shape partially having a flat plate shape, and has a through hole in which a screw or the like is screwed. The lead type capacitor 41 is connected to the anchor portion 11c of the conducting bar 11 and to the flat plate portion of the seat portion 21D by soldering, welding such as resistance welding, and the like.

In the sixth embodiment, the lead type capacitor 41 is directly connected to the conducting bar 11 and to the seat portion 21D, and thus the mounting board can be omitted. The capacitive element, used in the LC filter, may be a general lead part instead of a surface mounted component. As a result, the number of parts is reduced and the less expensive parts are used, whereby an attempt to reduce the component cost can be facilitated. The other configurations and the effects are the same as those in the first embodiment.

Figure 21:
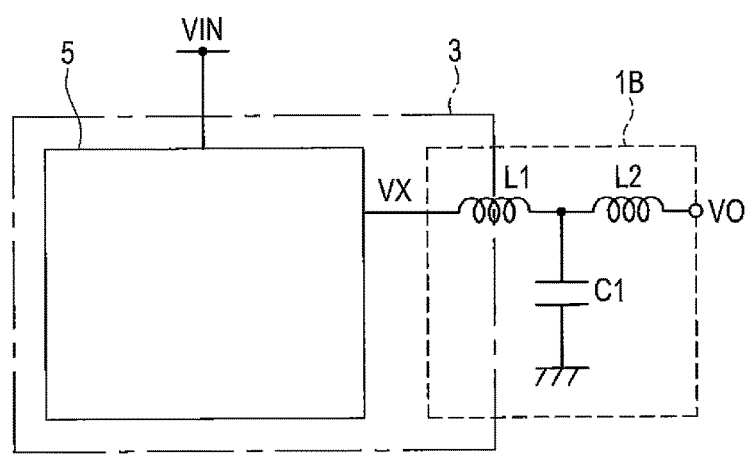
FIG. 21 is a circuit diagram illustrating a state where a T filter module, as one example of an output-noise reduction device in a seventh embodiment, is connected to a switching power supply.
Figure 22:
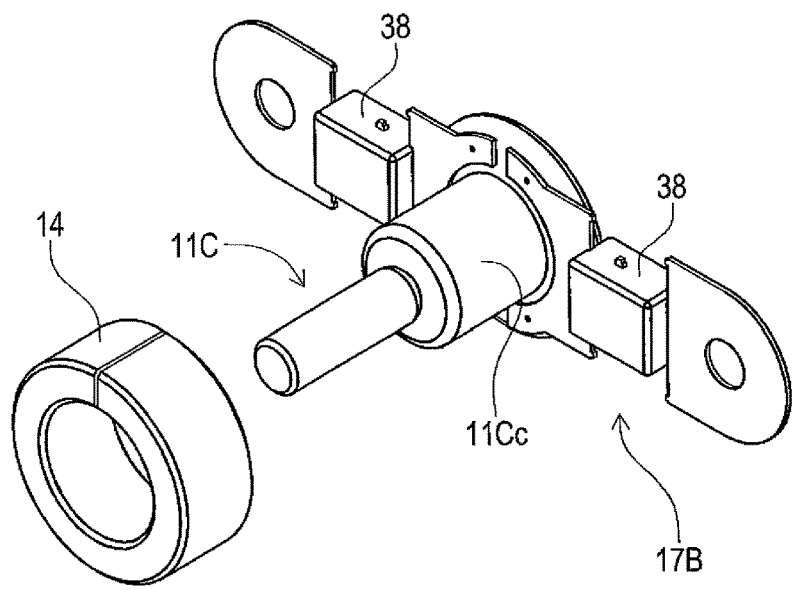
FIG. 22 is an exploded perspective view of the noise filter module in the seventh embodiment.
Figure 23:
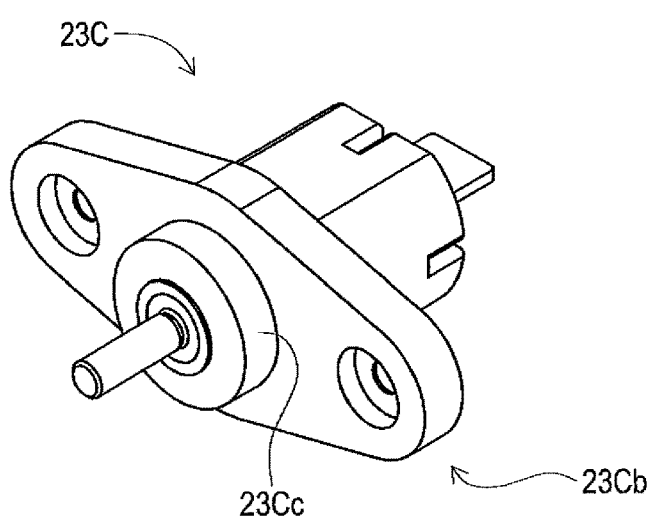
FIG. 23 is a perspective view of the noise filter module in the seventh embodiment as a result of molding.

FIGS. 21 to 23 illustrate a seventh embodiment of the present application. Here, a T filter module 1B is provided, and a configuration obtained by adding a magnetic body core 14 (choke coil L2) to the configuration in the fourth embodiment (FIG. 14) is employed. A conducting bar 11C is provided instead of the conducting bar 11B in the configuration in the fourth embodiment (FIG. 14). FIG. 21 illustrates a circuit diagram. FIG. 22 is an exploded perspective view of a main portion. FIG. 23 is a perspective view of a module.

The T filter module 1B illustrated in FIG. 21 has a configuration obtained by adding the choke coil L2 between the output terminal VO and a contact point between the choke coil L1 and the capacitor C1 in the noise filter module 1 in the first embodiment.

As illustrated in FIG. 22, the magnetic body core 14 is mounted on an outer side surface of the mounting board 17B so that the additional choke coil L2 is formed. The magnetic body core 14 is mounted in such a manner that its inner side surface covers the anchor portion 11Cc of the conducting bar 11C, In this configuration, the anchor portion 11Cc has a shape obtained by extending the length of the smaller diameter circular column of the anchor portion 11Bc of the conducting bar 11B, in the insertion direction. FIG. 22 illustrates a configuration of primary molded members 38 obtained by resin molding and encapsulating surface mounted chip capacitors (see FIG. 14). Before the resin molding to obtain a module 23C illustrated in FIG. 23, the primary molded members 38 are formed for the protection and the like of the mounted chip capacitors as the surface mounted components.

A portion of the anchor portion 11Cc covered with the magnetic body core 14 is expanded to be larger than the anchor portion 11Bc of the conducting bar 11B. Thus, the module 23C illustrated in FIG. 23 is obtained by molding with a portion where the magnetic body core 14 is mounted encapsulated while being protruded out of a flange portion 23Cb.

The noise filter module 1 is an example of an output-noise reduction device. The switching power supply 5 is an example of an electronic device. The output voltage is an example of an output signal. An auxiliary battery and an on-vehicle electronic device, such as an audio device, an air conditioning device, and a lighting device, receiving power supply voltage from the auxiliary battery are each an example of a supplying device. A terminal on a side of the connection hole 11Ad of the conducting bar 11A is an example of a connection terminal. The bolt 27 fixed to the bent portion 12 of the conducting bar 11A is an example of an output terminal. The magnetic body core 13A is an example of a first magnetic body core. The lead frame 17A is an example of a first mounting board. The hollow portion 13Aa is an example of a through hole of the magnetic body core 13A. The front and rear direction is an example of an insertion direction in which the conducting bar 11A is inserted into the through hole of the magnetic body core 13A. The chip capacitors 37 are an example of a capacitive element. The secondary molded member 23D is an example of a molded member. The recess and protrusion portion 61, the introduction hole 63, and the engagement portion 65 are examples of a processed portion.

The switching power supply 5 is an example of an electronic device. The output voltage is an example of an output signal. The output voltage path is an example of a conducting bar. The bolt portions 11a and 11Ba of the conducting bars 11 and 11B, bolt portions 111a, 112a, 113a, and 115a of conducting bars 111, 112, 113, and 115 described later, as well as terminal portions 113d and 114d of the conducting bar 113 and conducting bar 114 are each an example of a connection terminal and an output terminal. The magnetic body core 13 and magnetic body cores 131, 132, and 133 are each an example of a first magnetic body core. The magnetic body core 14 is an example of a second magnetic body core. The mounting boards 17, 17B, and 17C are examples of first and second mounting boards. Third and fourth fixing portions of the mounting boards 17, 17B, and 17C on the inner side in the third embodiment respectively correspond to first and second fixing portions of the mounting boards 17, 17B, and 17C on the outer side. The conducting bars 11 and 11B, anchor portions 11c and 11Bc of the conducting bars 112, 113, 114, and 115 described later, anchor portions 112c and 113c described later, trunk portions 111b and 115b described later of the conducting bars 111 and 115 described later, a groove portion 115c described later of the conducting bar 115, and the mounting boards 17, 17B, and 17C are examples of a movement restriction member.

As described above in detail, the noise filter module 1 in the first embodiment disclosed in the present application has the chip capacitors 37 (capacitor C1) disposed outside the metal casing 3. A part of the magnetic body core 13 on a side of the output terminal VO is disposed outside the metal casing 3. Thus, the portion of the conducting bar 11 serving as the output terminal VO is positioned outside the metal casing 3. Thus, the electromagnetic coupling between the switching power supply 5 and the capacitor C1 and the output terminal VO is prevented by the metal casing 3. All things considered, the radiation noise generated due to the switching operation is prevented from being transmitted to the capacitor C1 and the output terminal VO.

The ground potential GND is supplied from the metal casing 3 to the capacitor C1 accommodated in the flange portion 23b via the seat portions 21. Thus, the voltage fluctuation due to the switching operation is prevented from mixing in the ground potential GND. This is because the metal casing 3 has impedance low enough to prevent the voltage fluctuation, due to the flow of transient operating current as a result of the switching operation, from being transmitted in a circumventing manner via the metal casing 3. All things considered, the conductive noise can be prevented from reaching the output terminal VO in a circumventing manner via the capacitor C1 through the ground potential GND.

It is described above that the ground potential GND is supplied to the chip capacitors 37 (capacitor C1) from the metal casing 3. However, the present application is not limited to this. Any configuration can be employed as long as the voltage fluctuation due to the switching operation is prevented from being transmitted in a circumventing manner through the ground potential GND supplied to the capacitor C1. For example, even in a low impedance grounding wire line through which operating current flows due to the switching operation, the voltage drop might occur to cause the voltage fluctuation depending on the flowing operating current. In a grounding wire line having a parasitic inductance component, back electromotive force might be produced due to electromagnetic induction in accordance with intermittency of the operating current, to cause potential difference that might lead to voltage fluctuation. Supplying the ground potential GND through a path with a sufficiently low impedance such as the metal casing 3 is one example of preventing the voltage fluctuation in the grounding wire line described above from being transmitted to the ground potential GND supplied to the capacitor C1. Another example includes using a grounding wire line for supplying the ground potential GND to the switching power supply 5 and a grounding wire line for supplying the ground potential GND to the capacitor C1. The grounding wire lines are branched from a grounding terminal at a base end from which the ground potential GND is supplied, and then are connected. In this configuration, the operating current flowing in the ground potential GND in accordance with the switching operation flows in the grounding wire line branched from the grounding wire line through which the ground potential GND is supplied to the capacitor C1. Thus, the ground potential GND supplied to the capacitor C1 can be prevented from being affected by the operating current. As a result, the voltage fluctuation due to the switching operation can be prevented from being transmitted in a circumventing manner through the ground potential GND.

The magnitude and the transmission level of the radiation noise and conductive noise might differ among the positional relationships among parts and wiring routes in the metal casing 3. Thus, the positioning and wiring need to be carefully designed and determined for reducing noise. However, the noise can be reduced without carefully designing the arrangement and the wiring routes, when the noise filter module 1 is mounted to the metal casing 3 as the molded member 23. This is because the noise filter module 1 is connected to the electronic device such as the switching power supply 5 via the metal casing 3. More specifically, the voltage fluctuation can be prevented from being transmitted in a circumventing manner with the metal casing 3 providing the electromagnetic shielding effect and reducing the resistance for the ground potential. Thus, the individual circuit arrangement, the wiring route, and the like in the metal casing 3 need not to be optimized for a noise condition of the output terminal VO or for the specification/rating of the electronic device and the casing. The configuration can be generically used in accordance with the band of the noise to be reduced to provide the effects. All things considered, an attempt to simply, easily, and generically prevent the radiation noise and the conductive noise from mixing in the output signal can be facilitated.

The thickness of the flange portion 23b as a part of the mold portion 23 is defined by the thickness of the anchor portion lie or the seat portions 21. The thickness may set to be insignificant, compared with the size of the metal casing 3 accommodating the electronic device such as the switching power supply 5. The noise filter module 1 in the embodiments is not incorporated but has the flange portion 23b with the insignificant thickness protruding outside the metal casing 3, so that the package volume is less increased compared with the case where the noise filter module 1 is incorporated in the metal casing 3.

The noise filter module 1 is formed as the mold portion 23 filled with mold resin. Thus, reliability can be ensured against peripheral environments including vibration, dust, temperature, and the like. The configuration has especially high reliability when used in automobiles involving a harsh peripheral environment.

The electromagnetic shielding plates 15 are provided on both end surfaces of the magnetic body core 13 in the insertion direction. Thus, the conducting bar 11 inserted in the magnetic body core 13 can be shielded from the outside. Thus, the radiation noise can be prevented from being transmitted from the conducting bar 11 to the other electronic components and external electronic devices. Furthermore, the radiation noise can be prevented from mixing into the conducting bar 11 from the other electronic components and the external.

The conducting bar 11 is provided with the bolt portion 11a serving as a connection portion for connecting the external members on each of both end portions, and is formed as a single metal member linearly extending from one of the bolt portions 11a to the other. Thus, compared with a general configuration where the conducting bar includes a plurality of members each fixed by a fixing member, the contact resistance between members can be reduced. Furthermore, the number of parts can be reduced, assembly work can be simplified, and the manufacturing cost can be reduced.

The conducting bar 11 includes the bolt portions 11a, the center portion 11b, and the anchor portions 11c each formed to have a cylindrical shape. Thus, the conducting bar 11 can be formed by performing cold heading process on a single cylindrical base material, and thus can be easily manufactured.

The conducting bar 11 includes the anchor portion 11c having a larger diameter than the bolt portions 11a and the center portion 11b. Thus, the relative movement of the conducting bar 11 with respect to the molded member 23 in the insertion direction can be restricted, when the force in the insertion direction is applied to the conducting bar 11. The mounting board 17 and the conducting bar 11 fixed thereto have different shapes as viewed in the insertion direction. Thus, the mounting board 17 also restricts the relative movement of the conducting bar 11 with respect to the molded member 23 in the insertion direction, when the force in the insertion direction is applied to the conducting bar 11. Furthermore, with the mounting board 17 provided, the relative movement of the conducting bar 11 with respect to the molded member 23 in the circumference direction can be restricted, when the force in the circumference direction is applied to the conducting bar 11.

The conducting bar 11 includes the bolt portions 11a at its both end portions. Thus, the molded member 23 encapsulating the noise filter module 1 can be connected to the switching power supply 5, and the output terminal VO of the molded member 23 can be connected to the external electronic device, without providing additional members. For example, in an application for automobiles and the like where the noise reduction device is preferably fixed by screwing, the conducting bar 11 includes the bolt portions 11a and thus can be integrally attached. All things, considered, no additional parts, such as a fixing member, need to be used for the fixing, and the number of operation steps can be reduced, whereby an attempt to reduce the manufacturing cost can be facilitated.

In the noise filter module 1 in the second embodiment disclosed in the present application, fastening of the bolt inserted in the fixing hole 34Dd involves the rotational torque, in a direction of rotating the bolt, applied to the second fixing portion 33A. The second fixing portion 33A is provided with the recess and protrusion portion 61 as a surface with plurality of recesses and protrusions formed, as the processed portion. Thus, a large contact area can be achieved between the second fixing portion 33A and the resin on the inner side portion of the frame molded member 23Db encapsulating the second fixing portion 33A. Thus, the second fixing portion 33A can increase the resistance (frictional force) against the rotational torque due to the rotation of the bolt.

Thus, a defect such as deformation of the second fixing portion 33A receiving the excessive force due to the fastening can be prevented. The separation between the lead frame 17A and the frame molded member 23Db encapsulating the lead frame 17A due to the application of excessive rotational torque can be prevented. Thus, in the noise filter module 1 in the present embodiment, no gap is formed as a result of separation between the lead frame 17A and the resin on the inner side portion of the frame molded member 23Db due to the fastening work, whereby the entrance of water through the gap and the like can be prevented.

The second fixing portion 33A is formed to have a flat plate shape orthogonal to the front and rear direction (inserting direction) in which the conducting bar 11A is inserted, and has the fixing hole 33AA formed therethrough in the front and rear direction. Thus, the noise filter module 1 in the second embodiment can be fixed to the metal casing 3 with the bolt or the like inserted in the fixing hole 33AA from a front side (output side) in FIG. 1.

A result of the process of providing a larger resistance against the rotational torque is not limited to the recess and protrusion portion 61, and the introduction hole 63 illustrated in FIG. 10 and the engagement portion 65 illustrated in FIG. 11 may be formed. A single second fixing portion 33A may include a combination of the recess and protrusion portion 61, the engagement portion 65, and the engagement portion 65.

The electromagnetic coupling is prevented between the switching power supply 5 and each of the capacitors C1 and C2 and the choke coil L1 as components of the t filter module 1A in the third embodiment of the present application. This is because the π filter module 1A is disposed outside the metal casing 3A, and thus the capacitors C1 and C2 and the choke coil L1 accommodated in the molded member 23A are disposed outside the metal casing 3A to be electromagnetically shielded by the metal casing 3A.

The ground potential GND is supplied to the capacitors C1 and C2 accommodated in the molded member 23A from the metal easing 3A via the seat portions 21A. Thus, the voltage fluctuation due to the operation of the switching power supply 5 is prevented from mixing in the ground potential GND. This is because the metal casing 3A has an impedance low enough to prevent the voltage fluctuation due to the flow of the transitional operating current as a result of the operation of the switching power supply 5 from being transmitted to the metal casing 3A. All things considered, the voltage fluctuation can be prevented from reaching the capacitors C1 and C2 in a circumventing manner through the ground potential GND.

With the electromagnetic coupling to the capacitors C1 and C2 prevented and the voltage fluctuation prevented from being transmitted in a circumventing manner through the ground potential GND as described above, the radiation noise and the conductive noise are prevented from being transmitted to the output terminal VO.

In the π filter module 1A in the third embodiment, the two mounting boards 17 are provided to the conducting bar 11, whereby the relative movement of the conducting bar 11 in the insertion direction and in the circumference direction can be more effectively prevented compared with the first embodiment.

A portion of the flange portion of the molded member 23A, in the π filter module 1A in the third embodiment, protruding outside the metal casing 3A is thicker than that of the flange portion 23b in the first embodiment. Still, the thickness is insignificant compared with the size of the metal casing 3A accommodating the electronic device such as the switching power supply 5. Furthermore, the increase in the package volume can be reduced compared with the configuration where the π filter module 1A is incorporated in the metal casing 3A.

In the noise filter module 1 in the fourth embodiment disclosed in the present application, the first fixing portion 31B and the second fixing portion 33B of the mounting board 17B have a flat plate shape. Thus, the step of forming the mounting board 17B into an arch shape is not needed, unlike the first fixing portion 31 and the second fixing portion 33 in the first embodiment, Thus, the manufacturing cost can be reduced.

In the noise filter module 1 in the fifth embodiment disclosed in the present application, the inner side surface of the through holes 17Cb is covered with the cylindrical conducting wiring 39e connected to the conducting wiring 39b and the conducting wiring 39d respectively on the front and the back surfaces of the mounting board 17C. Thus, conduction between the seat portions 21 in a cylindrical shape and the conducting wiring 39b and the conducting wiring 39d can be achieved by inserting the seat portions 21 into the through holes 17Cb. The same applies to the through hole 17Ca. More specifically, conduction between the conducting bar 11 and the conducting wiring 39a and 39d can be achieved by inserting the bolt portion 11a of the conducting bar 11 into the through hole 17Ca. The connection of the conducting bar 11 and the seat portions 21 can be achieved with the cylindrical conductive wiring covering the inner side surfaces of the through holes 17Ca and 17Cb. Thus, a sufficiently large contact area for achieving the conduction can be secured, and the contact resistance can be lowered.

The noise filter module 1 in the sixth embodiment disclosed in the present application is different from the first embodiment in that no mounting board 17 is provided. Thus, an attempt to reduce the number of parts and simplify the manufacturing steps can be facilitated, whereby the manufacturing cost can be reduced.

The configuration and the effects not described in detail in the third to the seventh embodiments are the same as those in the first embodiment.

It is a matter of course that the technique disclosed in the present application is not limited to the embodiments described above, and can be modified and changed in various ways without departing from the gist of the present application.

For example, in the example described in the first embodiment, the chip capacitors 37 (capacitor C1) are disposed outside the metal casing 3, a part of the magnetic body core 13 on a side of the output terminal VO is encapsulated in the flange portion 23b, and the portion of the conducting bar 11 corresponding to the output terminal VO is positioned outside the metal casing 3. Thus, the metal casing 3 prevents the electromagnetic coupling from the inside components of the metal casing 3 such as the switching power supply 5, and thus the mixing of the radiation noise is reduced. However, the present application is not limited to this. The distal end portion of the magnetic body core 13 on a side of the output terminal VO needs not to protrude outside the metal casing 3. The portion of the conducting bar 11 corresponding to the output terminal VO is shielded by the metal casing 3 as long as the conducting bar protruding from the side of the output terminal VO is positioned in the casing opening 30 of the metal casing 3. Thus, the electromagnetic coupling is prevented, whereby the mixing of the radiation noise can be reduced. The noise filter module in which the chip capacitors 37 (capacitor C1) are shielded from the radiation noise can be achieved even when the magnetic body core 13 is positioned in the metal casing 3, as long as the chip capacitors 37 (capacitor C1) are positioned outside the metal casing 3 or in the casing opening 30 of the metal casing 3. The chip capacitors 37 thus shielded need not to be all the capacitors C1 in the noise filter module. When the plurality of chip capacitors 37 are connected in series or in parallel, the shielding effect can be achieved as long as at least one of the chip capacitors 37 connected in series or in parallel is positioned outside the metal casing 3 or in the casing opening 30 of the metal casing 3.

The entire molded member 23, the flange portion 23b encapsulating the chip capacitors 37 (capacitor C1), or the core portion 23a and the flange portion 23b encapsulating the part of the magnetic body core 13 on a side of the output terminal VO may be enclosed by a metallic member (metal wall). Thus, the members enclosed by the metallic member (metal walls) including the chip capacitors 37 (capacitor C1) and the portion of the conducting bar 11 that corresponds to the output terminal VO and protrudes from the magnetic body core 13 are electromagnetically shielded, and thus the radiation noise is prevented from being transmitted to them. In this configuration, the section from the output terminal VO to at least part of the chip capacitors 37 (capacitor C1) may be electromagnetically shielded. Thus, the electromagnetic coupling is prevented, and thus the radiation noise can be prevented from mixing in the output voltage.

In the configuration described in the first embodiment, the thermoset resin is used as resin forming a molded member encapsulating the noise filter module 1. It is a matter of course that thermoplastic resin such as Polyphenylene Sulfide (PPS) and Polybutylene Terephthalate (PBT) may also be used.

It is a matter of course that the second embodiment is not to be construed in a limiting sense and can be modified and changed in various ways without departing from the gist of the present application.

For example, in the described example, the thermoset resin is used as the resin material for encapsulating the primary molded member 47 and the secondary molded member 23D. However, this is not to be construed in a limiting sense. For example, thermoplastic resin such as Polyphenylene Sulfide (PPS) and Polybutylene Terephthalate (PBT) may also be used.

The shape and the like of the processed portion are merely an example, and can be changed as appropriate. For example, the recess and protrusion portion 61 that is partially provided on (the hatched portion in FIG. 9) the second fixing portion 33A, may also be provided over the entire second fixing portion 33A. The recess and protrusion portion 61 provided on both surfaces of the second fixing portion 33A may also be provided on a single surface. The processed portion is not limited to the shape with the recesses and the protrusions, and may be a shape obtained by forming a claw by bending a notched portion, formed on a part of the surface of the second fixing portion 33A, in the front and rear direction, for example. The introduction hole 63 having a circular shape in FIG. 10 may also have any other shape such as an ellipsoid or a triangle. The engagement portion 65 having the triangle wave shape in FIG. 11 may alternatively have a rectangular wave shape, a sinewave shape, or the like. The effects provided by the embodiments described above can also be obtained with such a configuration.

The slit 13B formed on the magnetic body core 13A for preventing the magnetic saturation from occurring, may be omitted depending on the physical configuration and the like of the magnetic body core 13A.

In the example described in the third embodiment, the filter module 1A includes the two mounting boards 17. However, the present application is not limited to this. At least one of the mounting boards 17 may be replaced with the mounting board 17B (FIG. 14) or the mounting board 17C (FIG. 18). The lead type capacitor such as a laminated ceramic capacitor may be mounted instead of the mounting board.

Other embodiments of the conducting bar are illustrated in FIGS. 24A to (E). The conducting bar 111 illustrated in FIG. 24A includes the bolt portion 111a and the trunk portion 111b. The conducting bar 111 includes no center portion 11b of the conducting bar 11 in the first embodiment, and thus has a structure with no anchor portion 11c in the first embodiment. Alternatively, the mounting board 17 described in the first embodiment may be provided, so that the movement in the insertion direction and in the circumference direction can be restricted.

Figure 24A:
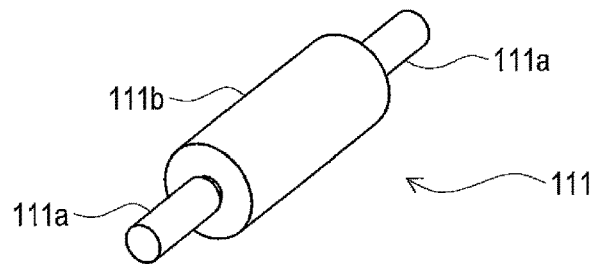
FIGS. 24A-E are diagrams schematically illustrating examples of a conducting bar in other embodiments.
Figure 24B:
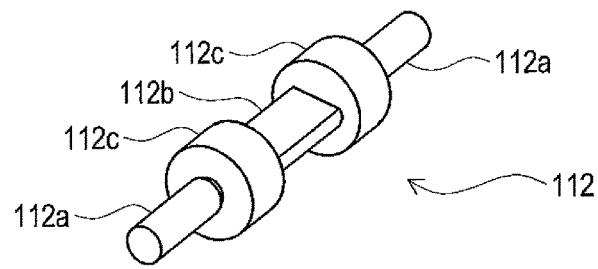

The conducting bar 112 illustrated in FIG. 24B includes the bolt portions 112a, a center portion 112b, and the anchor portions 112c. The center portion 112b of the conducting bar 112 is formed to have a flat plate shape. If the conducting bar 112 is employed, with a magnetic body core having rectangular inner side walls (for example, a rectangular U shaped magnetic body core 132 (see FIG. 25B) or a separation type magnetic body core 133 (see FIG. 25C) as illustrated in FIG. 25 described later, the surfaces of the center portion 112b of the conducting bar 112 can be at an equal distance from the inner side surfaces of the magnetic body core. The center portion 112b can be formed by compressing the center portion 11b of the conducting bar 11 in the example illustrated in the first embodiment, through a forging process and the like.

Figure 24C:
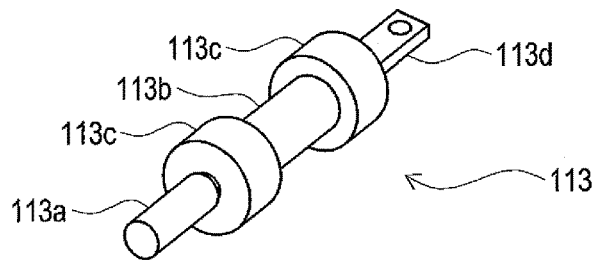

The conducting bar 113 illustrated in FIG. 24C includes the bolt portion 113a, a center portion 113b, the anchor portions 113c, and the terminal portion 113d. The terminal portion 113d is provided instead of the bolt portion 11a on one side of the conducting bar 11 in the first embodiment (on a side to be connected to the switching power supply 5). The terminal portion 113d has a flat plate shape and is provided with a connection hole. The shape of the terminal portion 113d is the same as conducting bars in general, and thus the conducting bar 113 of the present invention can be applied to existing electronic devices.

Figure 24D:
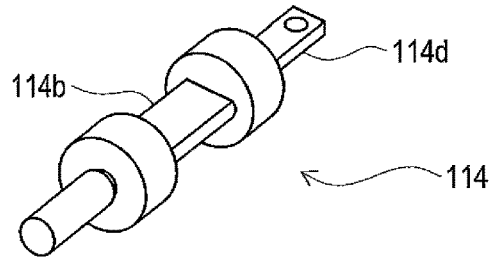

The conducting bar 114 illustrated in FIG. 24D includes a center portion 114b, having the same shape as the center portion 112b of the conducting bar 112 (see FIG. 24B), instead of the center portion 113b of the conducting bar 113 (see FIG. 24C). As in the case of the conducting bar 112, the magnetic body core 132 having a rectangular U shape as illustrated in FIG. 25B and the separation type magnetic body core 133 as illustrated in FIG. 25C are preferably used. As in the case of the conducting bar 113, the terminal portion 114d has a flat plate shape and is provided with a connection hole, and thus can be applied to existing electronic devices using conducting bars in general.

Figure 24E:
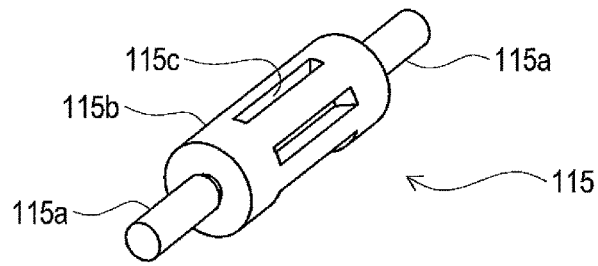

The conducting bar 115 illustrated in FIG. 24E includes the bolt portion 115a and the trunk portion 115b. The trunk portion 115b includes the groove portion 115c as an inward recess. The trunk portion 115b has a larger diameter than the bolt portion 115a. Furthermore, the molding material enters the groove portion 115c so that the relative movement in the insertion direction can be restricted. The relative movement in the circumference direction can also be restricted with the groove portion 115c. The groove portion 115c with a groove shape is not to be construed in a limiting sense. The same effects can be achieved with inward recess of any shape on the trunk portion 115b including holes having a circular or rectangular shape opening. The hole may be a screw hole, and a bolt small enough to be covered by the molded member may be attached to protrude from the trunk portion 115b. The trunk portion 115b may be processed to have a protrusion protruding outward from the trunk portion 115b.

Figure 25A:
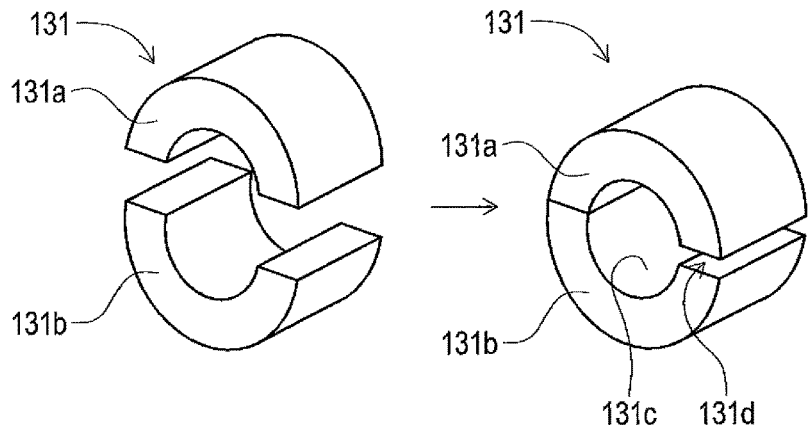
FIGS. 25A-C are diagrams schematically illustrating examples of a magnetic body core in other embodiments.
Figure 25B:
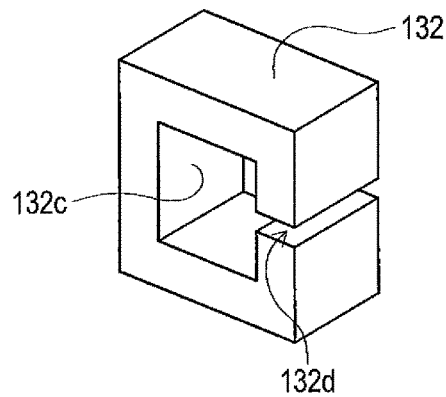
Figure 25C:
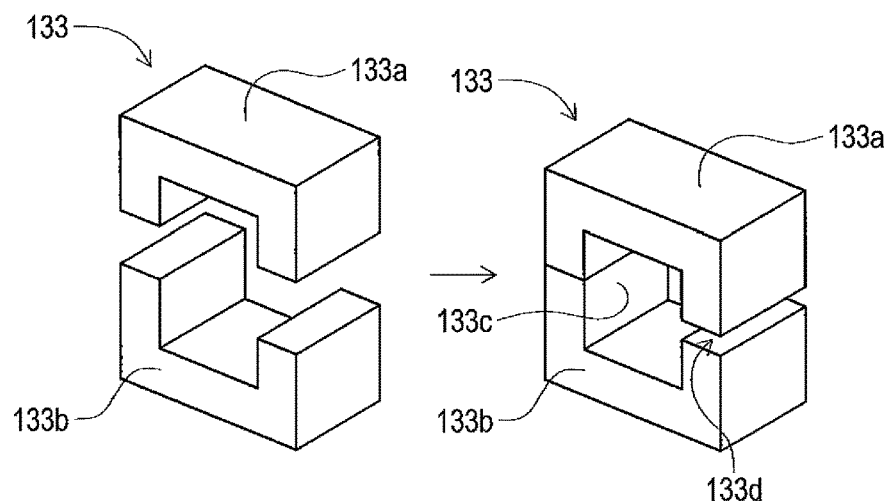

FIGS. 25A to 25C illustrate other embodiments of the magnetic body core. A magnetic body core 131 illustrated in FIG. 25A is a separation type magnetic body core in which the first and the second cores 131a and 131b, having a half annular shape, are combined in such a manner that a hollow portion 131c and a slit 131d are formed. The magnetic body core 132 illustrated in FIG. 25B is a rectangular U shaped magnetic body core including a hollow portion 132c and a slit 132d. The magnetic body core 133 illustrated in FIG. 25C is a separation type magnetic body core in which the first and the second cores 133a and 133b are combined in such a manner that a hollow portion 133c and a slit 133d are formed. In FIG. 25, the slits 131d, 132d, and 133d are each provided at a single portion on the magnetic path of the magnetic flux of the magnetic body core.

In the example described above, the magnetic body cores 13 and 131 to 133 are respectively provided with the slits 13b and 131d to 133d in parallel with the axis. However, the present application is not limited to this. The slits 13b and 131d to 133d are respectively formed to adjust the magnetic resistance in the magnetic body cores 13 and 131 to 133 for preventing the magnetic saturation. Thus, it is a matter of course that the configuration involving no magnetic saturation can be achieved without the slit depending on the physical configuration of the magnetic body core and the rated current flowing therein. In FIGS. 25A and 25C, two slits may be respectively provided to connecting portions for connecting between two cores.

In the output-noise reduction device according to the technique disclosed in the present application, the electromagnetic coupling from the electronic device can be prevented and the voltage fluctuation can be prevented from being transmitted in a circumventing manner through the ground potential, for the at least part of the capacitive element on the first mounting board on the side of the output terminal. Thus, the radiation noise and the conductive noise from the electronic device can be prevented from mixing in the output signal. Furthermore, the fixing by fastening of the fastening member can be appropriately achieved.

The following description is the aspects of the present application.

An output-noise reduction device disclosed in the present application is an output-noise reduction device that reduces noise mixed in an output signal output from an electronic device accommodated in a metal casing to a supplying device. The output-noise reduction device includes a conducting bar, a first magnetic body core, a molded member, and a first mounting board. The conducting bar is made of a conductive material, and has one end portion serving as a connection terminal to be connected to an output end of the electronic device, and another end portion serving as an output terminal. The first magnetic body core is made of a magnetic material and includes a through hole through which the conducting bar is inserted. The molded member is made of a resin material and encapsulates a portion of the conducting bar excluding the connection terminal and the output terminal and the first magnetic body core. The first mounting board is encapsulated by the molded member, and includes: a first fixing portion fixed to a portion of the conducting bar between the first magnetic body core and the output terminal; a second fixing portion connected to the metal casing; and a first connecting portion with a capacitive element connecting between the first fixing portion and the second fixing portion. A section from the output terminal to at least part of a main body portion including a capacitive component of the capacitive element mounted on the first mounting board is isolated from electromagnetic coupling from the electronic device.

Thus, what is known as an LC filter is formed. In the LC filter, the electromagnetic coupling between the electronic device and at least part of the capacitive element mounted on the first mounting board is prevented. The electromagnetic coupling includes capacitive coupling and inductive coupling. The radiation noise is transmitted through a space due to the electromagnetic coupling. Thus, the radiation noise generated due to an operation of the electronic device is not mixed in at least the part of the capacitive element mounted on the first mounting board on a side of the output terminal. The ground potential is supplied to the capacitive element on the first mounting board via the metal casing. The metal casing has a wide shape and thus has a sufficiently low impedance, whereby stable ground potential is achieved with voltage fluctuation prevented. Thus, the conductive noise can be prevented from being transmitted in a circumventing manner through the ground potential. All things considered, the radiation noise and the conductive noise are prevented from being transmitted to the output terminal, whereby an output signal with reduced noise is output.

The output-noise reduction device of the present application may include a seat portion that is made of a conductive material. The seat portion has a portion other than both end portions encapsulated by the molded member, and is press fitted to the metal casing when the molded member is fixed to the metal casing may be provided. The second fixing portion of the first mounting board may be fixed to the seat portion. Thus, when the molded member is fixed to the metal casing, the second fixing portion of the first mounting board is connected to the ground potential with the seat portion press fit to the metal casing.

A fixing hole in which a fastening member is inserted may be formed on the second fixing portion. The second fixing portion may be fixed to the electronic device by fastening the fastened member inserted in the fixing hole. A processed portion increasing resistance against rotational torque produced when the fastening member is rotated by the fastening may be formed on the second fixing portion.

Thus, with the processed portion, the second fixing portion has a large resistance against the rotational torque produced when the fastening member is rotated to be fastened. Thus, a defect such as deformation of the second fixing portion receiving the excessive force due to the fastening can be prevented. The separation between the first mounting board including the second fixing portion and the molded resin encapsulating the first mounting board due to the application of excessive rotational torque can be prevented. Thus, in the output-noise reduction device, no gap is formed as a result of separation between the first mounting board and the molded member due to the fastening work, whereby the entrance of water through the gap and the like can be prevented.

In the output-noise reduction device, to protect the conducting bar and the first magnetic body core, the conducting bar and the like need to be encapsulated by a resin material such as phenol resin for example. When the output-noise reduction device is used in a vehicle or the like for example, fastening with a fastening member such as a bolt needs to be performed for fixing to the vehicle. For example, when the bolt is inserted and rotated in a through hole formed in the molded member, rotational torque is applied to the molded resin and the member encapsulated therein (such as the conducting bar). Thus, the conducting bar and the like need to be prevented from separating from the molded resin. In the output-noise reduction device according to the technique disclosed in the present application, the resistance against the rotational torque can be increased, whereby the conducting bar and the like can be prevented from separating from the molded resin due to the application of the rotational torque.

In the output-noise reduction device of the present application, the second fixing portion may be formed to have a shape of a flat plate orthogonal to an insertion direction of the through hole. The fixing hole may be formed through the insertion direction of the through hole. In this configuration, for example, the output-noise reduction device can be fixed to the electronic device with the fastening member inserted in the fixing hole in the insertion direction of the through hole from a side of the output terminal of the conducting bar toward the connection terminal.

In the output-noise reduction device of the present application, the processed portion may be formed on a surface of the second fixing portion including a recess and protrusion portion to be in close contact with the molded member. A large contact area can be achieved between the second fixing portion with the recess and protrusion portion thus formed and the inner side portion of the molded member. Thus, the second fixing portion provides an increased resistance (frictional force) against the rotational torque produced when the fastening member is rotated.

In the output-noise reduction device of the present application, the processed portion may include an introduction hole in which the resin material for forming the molded member is introduced, the introduction hole being formed through the second fixing portion. Thus, with the resin material introduced in the introduction hole, the molded member encapsulating the second fixing portion can be securely fixed to the second fixing portion by the connection of the resin material on both sides in the insertion direction in the introduction hole. Thus, the second fixing portion can provide a larger resistance against the rotational torque produced when the fastening member is rotated.

In the output-noise reduction device of the present application, the processed portion may include an engagement portion formed along outer peripheral of the second fixing portion. Thus, the second fixing portion can achieve a large resistance against the rotational direction with the engagement portion provided on the outer peripheral engaging with the molded member in a rotational direction when the rotational torque of rotating the fastening member is applied.

The output-noise reduction device of the present application may include a second mounting board that is encapsulated by the molded member. The second mounting board includes third fixing portion fixed to the portion of the conducting bar between the magnetic body core and the connection terminal, a fourth fixing portion connected to the metal casing, and a second connecting portion with a capacitive element connecting between the third fixing portion and the fourth fixing portion. Thus, the capacitive element of the second mounting board is connected in addition to the capacitive element of the first mounting board and the inductor element connected in series with a path of the output signal due to the magnetic body core through which the conducting bar is inserted. Thus, what is known as a π filter is formed. The ground potential is supplied to the capacitive element on each of the first and the second mounting boards forming the π filter via the metal casing. The metal casing has a wide shape and thus has a sufficiently low impedance. Thus, stable ground potential with mixed noise reduced is achieved. All things considered, in the it filter, the adverse effect of the conductive noise transmitted from the ground potential via the capacitive element can be reduced. The output-noise reduction device of the present application may include a second magnetic body core that is disposed more on a side of the output terminal than the first mounting board, is made of a magnetic material, and the magnetic body core may may include a through hole through which the conducting bar is inserted. Thus, a T filter is formed.

In a state where the connection terminal of the conducting bar is connected to the output end of the electronic device in the metal casing and the output terminal of the conducting bar is disposed outside the metal casing through an opening of the metal casing through which the conducting bar is inserted, the at least part of the main body portion including the capacitive component of the capacitive element mounted on the first mounting board may be positioned outside the metal casing or in the opening of the metal casing. The metal casing prevents the electromagnetic coupling from the electronic device to the outside or in the opening of the metal casing. Thus, the at least part of the main body portion of the capacitive element mounted on the first mounting board positioned thereat can be prevented from being affected by the radiation noise. Thus, the noise can be reduced with the adverse effect of the electromagnetic coupling from the electronic device reduced by selecting an attached position of the output-noise reduction device on the metal casing, instead of providing an additional member/part.

At least a portion of the first magnetic body core on a side of the output terminal may be positioned outside the metal casing, or in the opening of the metal casing. Thus, not only the capacitive element on the first mounting board but also the portion (output terminal) of the conducting bar protruding from the first magnetic body core to a side of the output terminal in the inductor element formed by the first magnetic body core is disposed outside the metal casing or in the opening of the metal casing. Thus, the electromagnetic coupling from the electronic device to the portion of the conducting bar on the side of the output terminal can be prevented.

The output-noise reduction device of the present application may include a metal wall may which enclose a section from the output terminal to at least part of the main body portion including the capacitive component of the capacitive element mounted on the first mounting board. Thus, the section from the output terminal to the at least part of the main body portion of the capacitive element on the first mounting board with the conducting bar in between is enclosed by the metal wall to be electromagnetically shielded. Thus, the conducting bar to the output terminal and the at least part of the main body portion of the capacitive element on the first mounting board on a side of the output terminal can be disposed in an area where the electromagnetic coupling is prevented. With the metal wall providing the electromagnetic shielding effect, an attempt to prevent the electromagnetic coupling can be facilitated, and the parts can be disposed inside the metal casing where the radiation noise from the electronic device might be transmitted.

The output-noise reduction device of the present application may include an electromagnetic shielding plate on at least one of end surfaces of the first magnetic body core in the insertion direction of the through hole. Thus, the conducting bar inserted in the first magnetic body core can be shielded from the outside. The radiation noise can be prevented from being transmitted to the outside from the conducting bar due to the electromagnetic coupling. Furthermore, the radiation noise from the outside can be prevented from being transmitted to the conducting bar. The configuration can achieve a particularly high effect of shielding the electric field.

At least one of the first mounting board and the second mounting board may have a shape facing the resin material filling the molded member, as viewed in the insertion direction of the through hole or in a circumference direction. Thus, the mounting boards serve as a resistance against the resin material filled in the molded member for the relative movement of the conducting bar with respect to the molded member in the insertion direction or in the circumference direction, when the external force in the insertion direction or the circumference direction is applied to the conducting bar. Thus, the movement can be restricted.

The conducting bar may include a movement restriction member configured to restrict relative movement of the conducting bar in the insertion direction of the through hole with respect to the molded member. Thus, the movement restriction member serves as a resistance against the resin material filling the molded member, and thus can restrict the relative movement of the conducting bar with respect to the molded member in the insertion direction, when the external force in the insertion direction is applied to the conducting bar.

In this configuration, the movement restriction member may include a portion in a part of the conducting bar encapsulated by the molded member, the portion having a cross-sectional shape different from other portions as viewed in the insertion direction of the through hole. Thus, when the external force in the insertion direction is applied to the conducting bar, the portion representing the difference in the cross-sectional shape serves as the resistance against the external force, whereby the relative movement of the conducting bar in the insertion direction with respect to the molded member can be restricted.

The conducting bar may be formed with a single member from the connection terminal to the output terminal thereof. Thus, unlike in a configuration in which the conducting bar includes a plurality of members, a fixing member for fixing between the members can be omitted. Thus, there is no contact resistance at the connecting portion between the members, whereby an electrical resistance can be reduced in a section between the connection terminal and the output terminal. Furthermore, the fixing work can be omitted, whereby the manufacturing processing can be simplified and the cost reduction can be achieved. At least one of the connection terminal and the output terminal of the conducting bar may have a bolt structure. Thus, the output-noise reduction device can be securely fixed and thus connected to the electronic device without providing an additional member.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. An output-noise reduction device configured to reduce noise mixed in an output signal output from an electronic device accommodated in a metal casing to a supplying device, the output-noise reduction device comprising:
 a conducting bar that is made of a conductive material, and has one end portion serving as a connection terminal to be connected to an output end of the electronic device, and another end portion serving as an output terminal;
 a first magnetic body core that is made of a magnetic material and includes a through hole through which the conducting bar is inserted;
 a molded member that is made of a resin material and encapsulates a portion of the conducting bar excluding the connection terminal and the output terminal and the first magnetic body core; and a first mounting board that is encapsulated by the molded member, and includes: a first fixing portion fixed to a portion of the conducting bar between the first magnetic body core and the output terminal; a second fixing portion connected to the metal casing; and a first connecting portion with a capacitive element connecting between the first fixing portion and the second fixing portion, wherein a section from the output terminal to at least part of a main body portion including a capacitive component of the capacitive element mounted on the first mounting board is isolated from electromagnetic coupling from the electronic device.

2. The output-noise reduction device according to claim 1 further comprising a seat portion that is made of a conductive material and has a portion other than both end portions encapsulated by the molded member and is press fitted to the metal casing when the molded member is fixed to the metal casing, wherein the second fixing portion of the first mounting board is fixed to the seat portion.

3. The output-noise reduction device according to claim 1, wherein a fixing hole in which a fastening member is inserted is formed on the second fixing portion, the second fixing portion is fixed to the electronic device by fastening the fastened member inserted in the fixing hole, and a processed portion increasing resistance against rotational torque produced when the fastening member is rotated by the fastening is formed on the second fixing portion.

4. The output-noise reduction device according to claim 3, wherein the second fixing portion is formed to have a shape of a flat plate orthogonal to an insertion direction of the through hole, and the fixing hole is formed through the insertion direction of the through hole.

5. The output-noise reduction device according to claim 3, wherein the processed portion is formed on a surface of the second fixing portion including a recess and protrusion portion to be in close contact with the molded member.

6. The output-noise reduction device according to claim 4, wherein the processed portion is formed on a surface of the second fixing portion including a recess and protrusion portion to be in close contact with the molded member.

7. The output-noise reduction device according to claim 3, wherein the processed portion includes an introduction hole in which the resin material for forming the molded member is introduced, the introduction hole being formed through the second fixing portion.

8. The output-noise reduction device according to claim 4, wherein the processed portion includes an introduction hole in which the resin material for forming the molded member is introduced, the introduction hole being formed through the second fixing portion.

9. The output-noise reduction device according to claim 3, wherein the processed portion includes an engagement portion formed along outer peripheral of the second fixing portion.

10. The output-noise reduction device according to claim 4, wherein the processed portion includes an engagement portion formed along outer peripheral of the second fixing portion.

11. The output-noise reduction device according to claim 1 further comprising a second mounting board that is encapsulated by the molded member, and includes: a third fixing portion fixed to the portion of the conducting bar between the first magnetic body core and the connection terminal; a fourth fixing portion connected to the metal casing; and a second connecting portion with a capacitive element connecting between the third fixing portion and the fourth fixing portion.

12. The output-noise reduction device according to claim 1 further comprising a second magnetic body core that is disposed more on a side of the output terminal than the first mounting board, is made of a magnetic material, and includes a through hole through which the conducting bar is inserted.

13. The output-noise reduction device according to claim 1, wherein in a state where the connection terminal of the conducting bar is connected to the output end of the electronic device in the metal casing and the output terminal of the conducting bar is disposed outside the metal casing through an opening of the metal casing through which the conducting bar is inserted, the at least part of the main body portion including the capacitive component of the capacitive element mounted on the first mounting board is positioned outside the metal casing or in the opening of the metal casing.

14. The output-noise reduction device according to claim 10, wherein at least a portion of the first magnetic body core on a side of the output terminal is positioned outside the metal casing, or at least a portion of the first magnetic body core on the side of the output terminal is positioned in the opening of the metal casing.

15. The output-noise reduction device according to claim 1 further comprising a metal wall which encloses a section from the output terminal to at least part of the main body portion including the capacitive component of the capacitive element mounted on the first mounting board.

16. The output-noise reduction device according to claim 1 further comprising an electromagnetic shielding plate on at least one of end surfaces of the first magnetic body core in the insertion direction of the through hole.

17. The output-noise reduction device according to claim 1, wherein at least one of the first mounting board and the second mounting board has a shape facing the resin material filling the molded member, as viewed in the insertion direction of the through hole or in a circumference direction of the through hole.

18. The output-noise reduction device according to claim 1, wherein the conducting bar includes a movement restriction member configured to restrict relative movement of the conducting bar in the insertion direction of the through hole with respect to the molded member.

19. The output-noise reduction device according to claim 15, wherein the movement restriction member includes a portion in a part of the conducting bar encapsulated by the molded member, the portion having a cross-sectional shape different from other portions as viewed in the insertion direction of the through hole.

20. The output-noise reduction device according to claim 1, wherein the conducting bar is formed with a single member from the connection terminal to the output terminal thereof, and at least one of the connection terminal and the output terminal has a bolt structure.

* * * * *